United States Patent [19]
Rosenthal et al.

[11] Patent Number: 5,646,521
[45] Date of Patent: Jul. 8, 1997

[54] ANALOG CHANNEL FOR MIXED-SIGNAL-VLSI TESTER

[75] Inventors: Daniel Rosenthal, Saratoga; Kannan Konath, Fremont, both of Calif.; Robert Whyte, Ringwood, United Kingdom; Eric Norton, Cupertino; Stuart Robert Pearce, San Jose, both of Calif.

[73] Assignee: Schlumberger Technologies, Inc., San Jose, Calif.

[21] Appl. No.: 510,397

[22] Filed: Aug. 1, 1995

[51] Int. Cl.$^6$ .................................. G01R 31/28
[52] U.S. Cl. ........................ 324/158.1; 371/22.1
[58] Field of Search ................ 324/158.1, 73.1, 324/537; 371/22.1, 22.3, 22.4

[56] References Cited

U.S. PATENT DOCUMENTS

| | | | |
|---|---|---|---|
| 5,243,273 | 9/1993 | McAuliffe et al. | 371/22.1 |
| 5,568,493 | 10/1996 | Morris | 371/22.3 |
| 5,577,052 | 11/1996 | Morris | 371/22.5 |

OTHER PUBLICATIONS

M. Mahoney, Tutorial: DSP–Based Testing of Analog and Mixed–Signal Circuits, The Computer Society of the IEEE, 1985, pp. 122–123. (Month Unavailable).

Schlumberger ITS 9000FX Hardware Reference Manual, Schlumberger Technologies, Aug. 1993, Figures 1–5 (CPU Subsystem Block Diagram) and A–1 (ITS9000FX Block Diagram with APG and Scan Options).

Dual ADSP–21020 Real–Time Signal Processing VME Board, Ixthos IXD 7232, Ixthos, Inc. Dec. 1994, 4–page brochure.

*Primary Examiner*—Kenneth A. Wieder
*Assistant Examiner*—Russell M. Kobert
*Attorney, Agent, or Firm*—Bruce D. Riter

[57] ABSTRACT

Mixed-signal tester architecture and methods are provided which minimize transfer of data, offer parallel data post-processing within the analog channels, and allow flexible synchronization. Multiple analog channels each have a source digital signal processor (DSP), a digital source sequencer, digital source instrumentation, analog source instrumentation, analog measure instrumentation, digital measure instrumentation, a digital pin multiplexer, a digital measure sequencer, DSP-addressable multi-bank capture memory, a capture digital signal processor, and an inter-DSP feedback path for communication between the source DSP and the capture DSP. Each analog channel can be arranged in a feedback loop through either its analog and/or digital instrumentation using the inter-DSP feedback path. DUT response is processed in the channel, the result is used to define parameters for a subsequent test cycle, and a signal corresponding to these parameters is generated and applied to the DUT. This loop-back of the result of a test cycle within the analog channel to define the next test cycle speeds up the test process. The source DSP can synthesize signals in real time and apply these to the DUT through analog or digital source instrumentation, and can synthesize source sequencer memory addresses (pointers to waveform-data stored in memory which represent waveforms or waveform segments) in real time and apply these signals to the DUT through analog or digital source instrumentation. DUT response is written to capture-memory in the channel which is directly addressable by the capture DSP, avoiding transfer of data before processing and further speeding the test process. Multi-bank capture memory controlled by the capture DSP allows data representing DUT response to be written into one bank while previously-written data in another bank is processed. This interleaving of data capture and data processing allows simultaneous capture and processing, further speeding the test process.

22 Claims, 25 Drawing Sheets

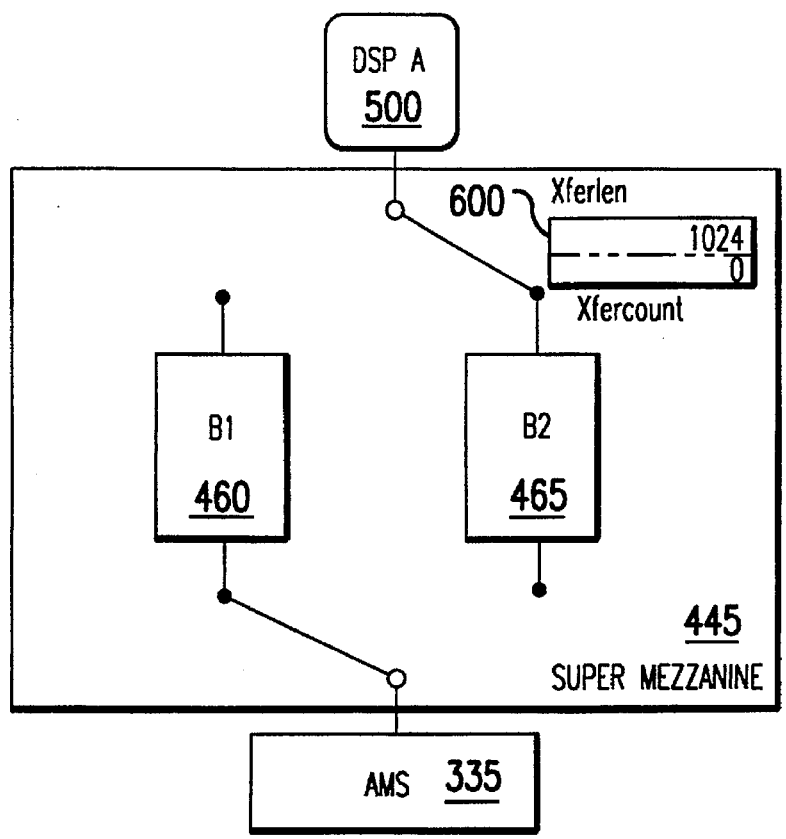
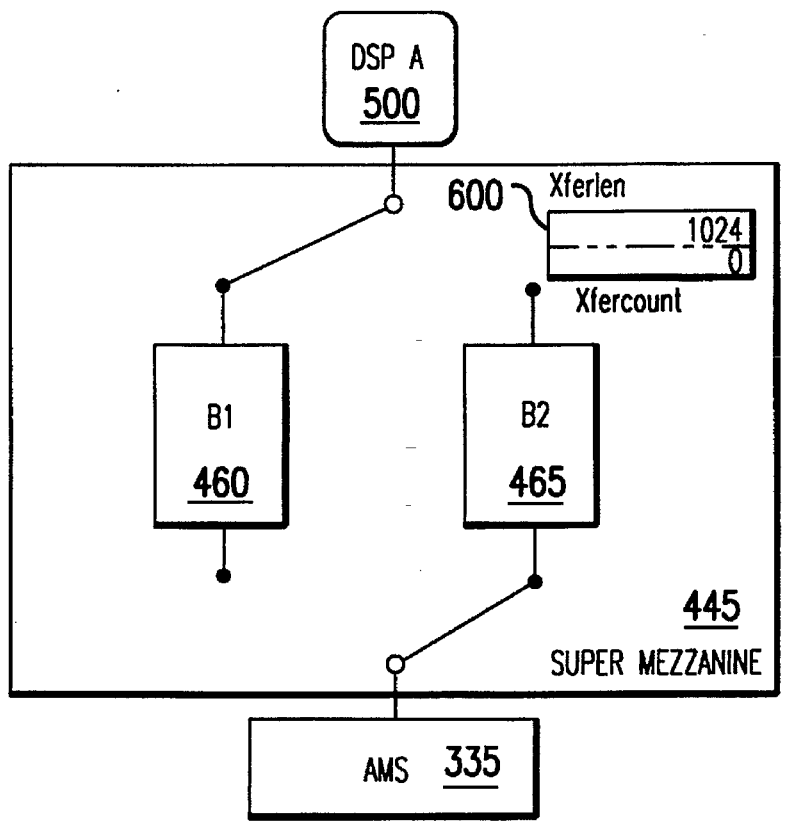

5,646,521

ANALOG CHANNEL FOR MIXED-SIGNAL-VLSI TESTER

BACKGROUND OF THE INVENTION

1. Field of the Invention

The present invention relates to methods and apparatus for testing of mixed-signal VLSI devices.

2. The Prior Art

Digital integrated circuit (IC) devices are typically tested by applying to pins of the device a pattern of binary stimulus signals in predetermined patterns and timing relationships. The digital test system looks at the resulting digital output signals of the device and compares them to a pre-defined truth table. A pass or fail decision results, depending on whether the bits (1's and 0's) at the device's output pins match the bits of the truth table during each time interval. Test systems for such devices are flexible and programmable to suit the requirements of the type of device to be tested. An example of a high-speed, programmable digital test system is the ITS 9000 FX system commercially available from Schlumberger Technologies, San Jose, Calif.

Other devices to be tested are not purely digital. These devices, known as "mixed-signal" devices, can have both digital and analog signal characteristics. Mixed signal devices often are mostly digital, but cannot be tested as purely digital devices are tested. Mixed signal devices can have pins which require one or more analog signal inputs (e.g., analog-to-digital converters (ADC's)) or one or more analog signal outputs (e.g., digital-to-analog converters (DAC's)) in addition to digital-signal inputs or outputs. Mixed signal devices can have pins which receive or supply digital representations of analog signals (e.g., coder-decoder devices (codecs)). Digital representations of analog signals differ from digital signals in that information encoded in digital form represents analog values. It is not enough to compare output bits of the encoded signal to a pre-defined truth table within a time window, because it is the information encoded in the 1's and 0's which must be evaluated to determine whether the device is operating as it should. The encoded signal may be in the form of serial data on a pin or parallel data on multiple pins, and may be encoded using any of a variety of schemes. In addition to testing direct-current (DC) characteristics of the device, the tester must recognize as acceptable any number of different bit combinations which represent essentially the same analog value within some error band. To analyze the output of the DUT, digital signal processing is used to extract quantitative performance parameters from the analog and digital output signals.

Testing of mixed-signal devices is time-consuming. An individual test cycle may consist of applying a set of input stimuli to the device and measuring the response of the device. For example, an analog voltage is applied to an ADC and the resulting digital output is detected. The test cycle is repeated for many different sets of stimuli to evaluate the performance of the device under various conditions. For example, analog voltages are applied to an ADC over its expected range of operation. If the signal-to-noise ratio of the measurement is low, multiple test cycles may have to be performed for each set of input stimuli and the results averaged. Repeatability of device performance may also need to be tested, requiring still more test cycles.

The stimuli to apply to the DUT often depend on its response to stimuli applied in a previous test cycle. Post-processing must therefore be done quickly if the overall test time is to be kept within reason.

Conventional mixed signal test systems are known in which a single host computer controls the overall test process and also performs digital signal processing for multiple analog channels. Data from multiple sources is processed synchronously with a main test program. In some test systems the host computer is augmented by an array processor or digital signal processor. Even if fast Fourier transform (FFT) processing is performed in each analog channel, test systems in which computing resources are shared by the channels have inherent drawbacks. First, a large quantity of information must pass through each analog channel which supplies signals to or receives signals from the DUT. Signals from the DUT are digitized and captured in memory in the channel. This large quantity of data must be transferred via a bus to the shared processor before post-processing can begin. This data-transfer delay becomes significant when multiplied by the number of channels and by the number of test cycles to be performed on the DUT. Second, transferring the data over a common bus to the shared processor must be done channel-by-channel in sequence. Data is then post-processed in the shared processor and/or array processor channel-by-channel in sequence. Sequential transfer and processing likewise impose a throughput delay. Testing speed is limited by the architecture of the test system.

In addition, prior art systems have a single program "thread"—the main program. That is, the main program performs the capture and then the post-processing of data through the shared processor. Processes forked off to a shared array processor or DSP do not run in parallel with the main program. Hence the DSP engine is not utilized in an optimal manner in the prior-art systems because the system does not allow truly asynchronous control of the DSP engine.

Mixed signal devices which handle both analog and digital signals have greater functionality, performance and speed than ever. These devices must be tested as a system, in their working order, with combined testing of digital and analog circuitry including DC characteristics. To test a mixed signal device as a system, the generation and measurement of analog and digital signals, input to and output from the device, require flexible synchronization. The testers available are not adequate to provide synchronous and asynchronous control of mixed signal devices. Faster and more flexible test systems for mixed-signal devices are desired.

SUMMARY OF THE INVENTION

In accordance with preferred embodiments of the invention, a test-system architecture and method are provided which minimize the transfer of data, offer parallel data post-processing within the analog channel, and allow flexible synchronization.

A plurality of analog channels is provided, each having a source digital signal processor, a data source sequencer, digital source instrumentation, analog source instrumentation, analog measure instrumentation, digital measure instrumentation, a digital pin multiplexer, a digital measure sequencer, DSP-addressable multi-bank capture memory, a capture digital signal processor, and an inter-DSP feedback path for communication between the source DSP and the capture DSP. Each analog channel can be arranged in a complete feedback loop through either its analog or digital instrumentation, or a combination thereof, using the inter-DSP feedback path.

Response of the DUT is processed in the channel, the result of processing is used to define a parameters for a subsequent test cycle, and a signal corresponding to these parameters is generated and applied to the DUT. The ability to loop-back the result of a test cycle in this manner within the analog channel so as to define the next test cycle speeds up the testing process. The source DSP can synthesize signals in real time and apply these to the DUT through the analog or digital source instrumentation. The source DSP can synthesize source sequencer memory addresses (pointers to waveform-data stored in memory which represent waveforms or waveform segments) in real time and apply these signals to the DUT through the analog or digital source instrumentation.

Response of the DUT is written to capture-memory in the channel which is directly addressable by the capture DSP rather than going through temporary storage buffers. Avoiding transfer of data before processing further speeds the testing process. Multi-bank capture memory under control of the capture DSP allows data representing DUT response to be written into one bank while previously-written data in another bank is processed. Interleaving of data capture and data processing in this way allows data capture and data processing to proceed simultaneously, further speeding the testing process.

With source and capture DSP's for each analog channel, a "threading" technique is used in which each of a number of process threads will execute a process independently of the other threads, to optimize utilization of resources. The main thread of the testing process is not constrained by the need for frequent communication with the DSP's and can perform various other tasks (computation, buffer management, digital tests not involving analog channel hardware, etc.) after spawning various processes to be run on the DSP's of the analog channels. Since each analog channel of the test system is self-contained (i.e., the analog channels do not share processing resources), multiple mixed-signal measurements can be performed in parallel with no degradation in testing time. Channels can be programmed singularly or in sets to facilitate fast test times for parallel testing. Analog clocks produce high-accuracy, high resolution, low-jitter clock signals which are phase-locked with a system master clock (and thus with the digital sub-system) to facilitate DSP techniques.

Processes are independent but can share data, if required. A process manager keeps track of the different threads being executed. Synchronization of processes is achieved effectively, at a predetermined point in time, where decision making or dependencies arise. This approach ensures optimal use of the DSP for data capture and post-processing. There is no latency time required for the movement of captured data from the capture memory to the capture DSP. Since the capture DSP can directly access the capture memory, the captured data need not be transferred from capture memory to a distinct DSP (or array processor) memory before processing can begin.

These and other features of the invention are disclosed in more detail below with reference to the accompanying drawing figures.

BRIEF DESCRIPTION OF THE DRAWING

FIGS. 6 and 7 show the analog channel of FIG. 4 in block mode of operation;

DETAILED DESCRIPTION

Figure 1:
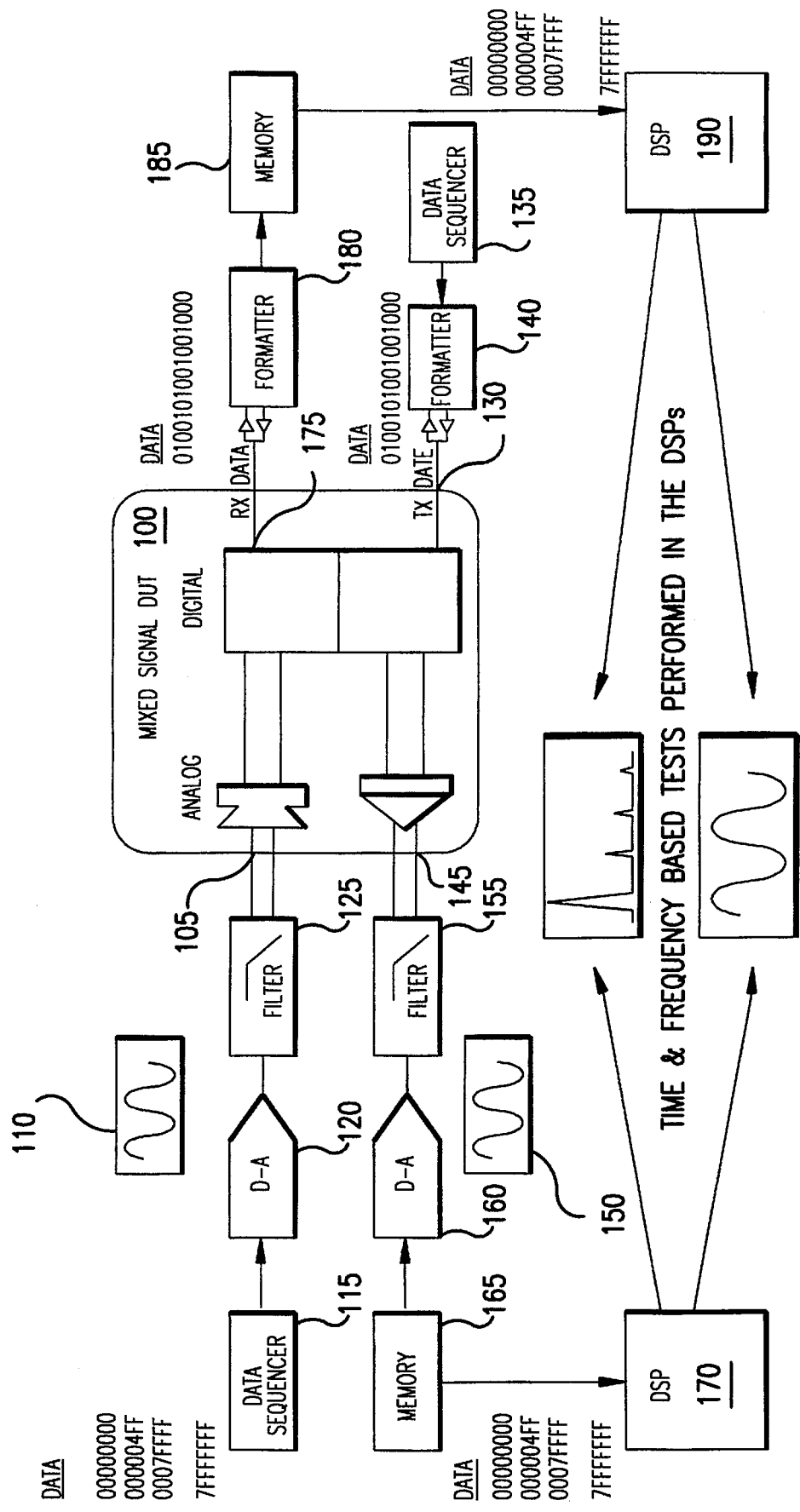
FIG. 1 illustrates some functional capabilities of a mixed-signal tester in accordance with the invention.

FIG. 1 illustrates some functional capabilities of a mixed-signal tester in accordance with the invention. A mixed-signal DUT 100 can have an analog input 105 to which an analog stimulus signal of specified format is to be supplied, e.g., a sine wave 110. The analog stimulus signal is represented as digital data which is supplied by a data sequencer 115 and converted to analog form by a DAC 120. The analog signal is then supplied to input 105 via a filter 125. A mixed-signal DUT 100 can have a digital input 130 to which analog information encoded as digital data of specified format is to be supplied. The digital data is supplied by a data sequencer 135 to a formatter 140 which supplies the formatted signal to the digital input 130.

A mixed signal DUT can have an analog output 145 which delivers an analog signal 150 to be analyzed by the test system. The signal is passed through a filter 155 to an ADC 160. The resulting digitized signal is stored in capture memory 165 which is accessible to a DSP 170. A mixed signal DUT can have a digital output 175 which delivers a digital signal representing analog information. The digital signal is passed to a formatter 180 which decodes the, digital signal and stores the resulting decoded information in capture memory 185. Data in capture memory 185 is accessible to a DSP 190. DSP 170 and DSP 190 are programmable to perform time-based and frequency-based analysis of the signals received from the DUT.

Figure 2:
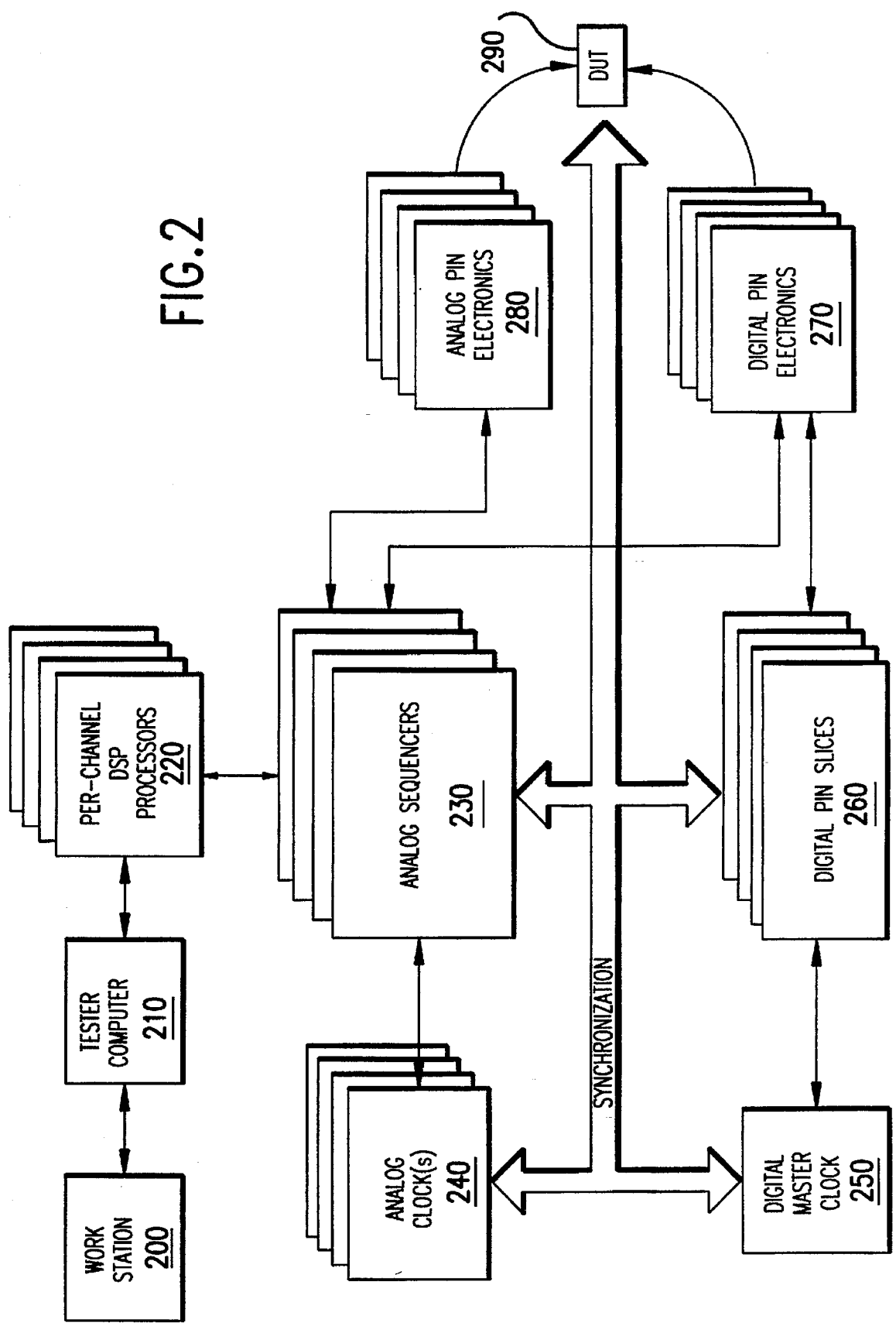
FIG. 2 shows an architectural overview of a mixed-signal test system in accordance with the invention.

FIG. 2 shows an architectural overview of a mixed-signal test system in accordance with the invention. A workstation 200 provides a user interface for top-level programming and control of the tester, and communicates with a tester computer 210 which in turn communicates with DSP processors 220. A pair of DSP processors is provided for each analog channel, as described in more detail below. DSP processors 220 drive analog sequencers 230, which receive clock signals as needed from analog clock sources 240. Analog clock sources 240 are referenced to a digital master clock 250. Digital pin "slices" 260 receive a timing reference from digital master clock 250. Digital pin slices 260 communicate with digital pin electronics 270. Analog sequencers 230 communicate with analog pin electronics 280. Digital pin electronics 270 and analog pin electronics 280 supply stimulus signals to and receive response signals from pins of the device under test (DUT) 290. The analog and digital signals are coordinated through synchronization of analog sequencers 230, analog-channel clock-signal generators 240, digital master clock-signal generator 250 and digital pin slices 260.

Figure 3:
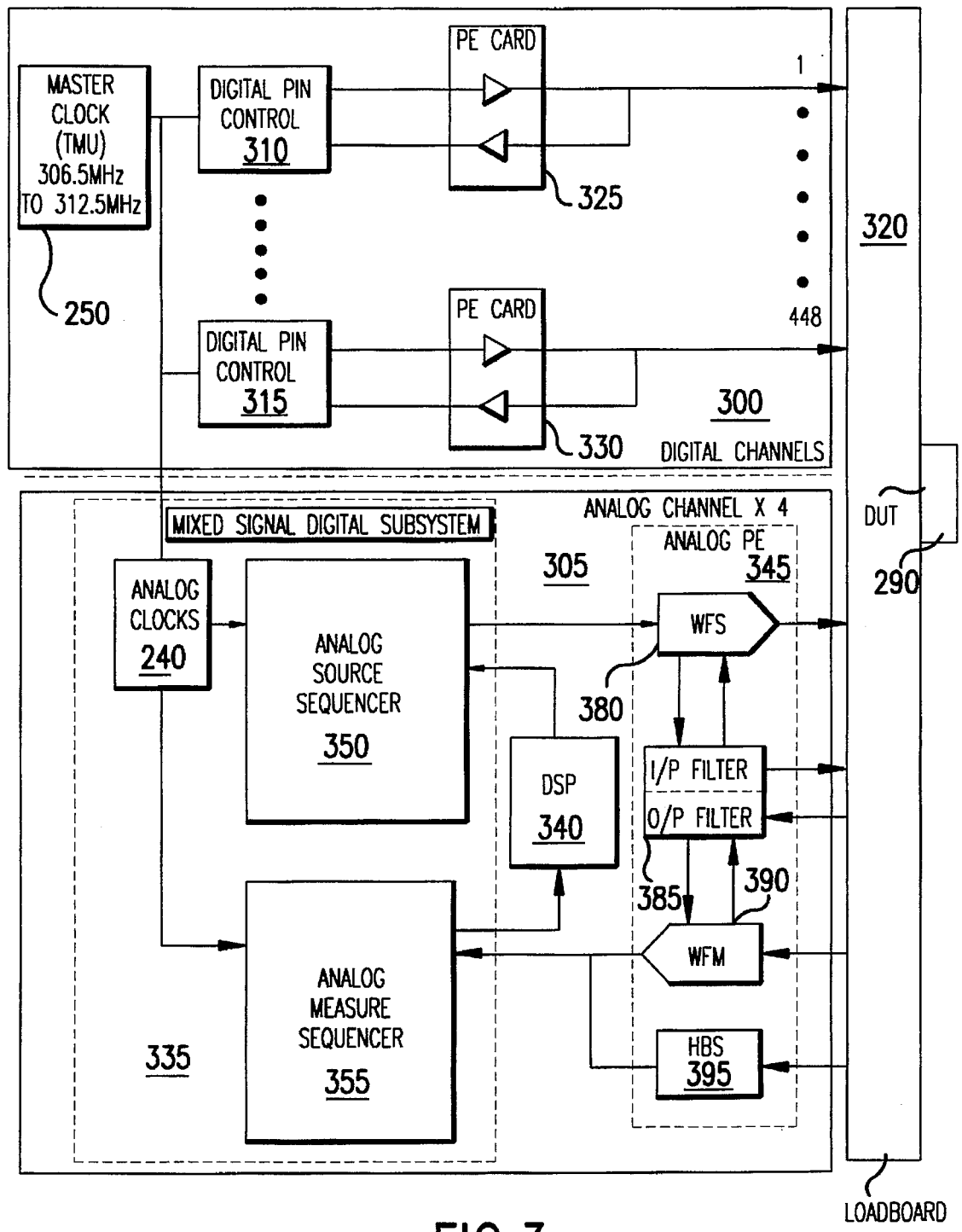
FIG. 3 shows a high-level block diagram of the signal channels of a mixed-signal test system in accordance with a preferred embodiment of the invention.

FIG. 3 shows a high-level block diagram of the digital channels 300 and analog channels 305 of a mixed-signal test system in accordance with a preferred embodiment of the invention. The number of digital channels 300 and analog channels 305 is a matter of design choice; a preferred embodiment has 448 digital channels and four analog channels. The controllable master clock 250 supplies a clock signal at, for example, 306.5 MHz to 312.5 MHz to the digital pin slice (digital pin controller) of each digital channel and to the analog clock generator of each analog channel, e.g., to digital pin controller 310 of digital channel 1, to digital pin controller 315 of digital channel 448, and to analog-channel clock-signal generators 240.

The digital pin controllers communicate with the DUT via pin electronics (PE) cards and a loadboard 320 on which the DUT is mounted, e.g., digital pin controllers 310 and 315 communicate with DUT 290 via PE cards 325 and 330. The digital channels operate in conventional manner: each digital channel is programmable in conventional manner to drive a pin of the DUT in accordance with a predetermined pattern and/or detect digital signals on a pin of the DUT for comparison with an expected response pattern.

Each analog channel has a mixed-signal digital subsystem 335, a programmable digital signal processor (DSP) module 340, and analog pin electronics (PE) 345. Mixed-signal digital subsystem 335 includes clock-signal generators 240, an analog-source sequencer module 350 and an analog-measure sequencer module 355. Analog PE 345 includes a waveform source (WFS) 380, input (I/P) and output (O/P) filters 385, and a waveform measurer 390.

Digital representations of analog signal patterns to be applied to the DUT are generated by analog-source sequencer module under control of programmable DSP module 340 in synchronization with clock signals from clocks 240. These digital representations are supplied to waveform source 380, which converts them to analog stimulus signals. The analog stimulus signals can be passed through filters 385 as needed, and are supplied to DUT 290 via loadboard 320.

Analog response signals from DUT 290 are passed via loadboard 320 to waveform measurer 390 for digitization. The analog response signals can be passed through filters 385 as needed. Digital representations of the analog response signals are passed to analog-measure sequencer module 355 for storage and for post-processing and analysis by DSP module 340.

Figure 4:
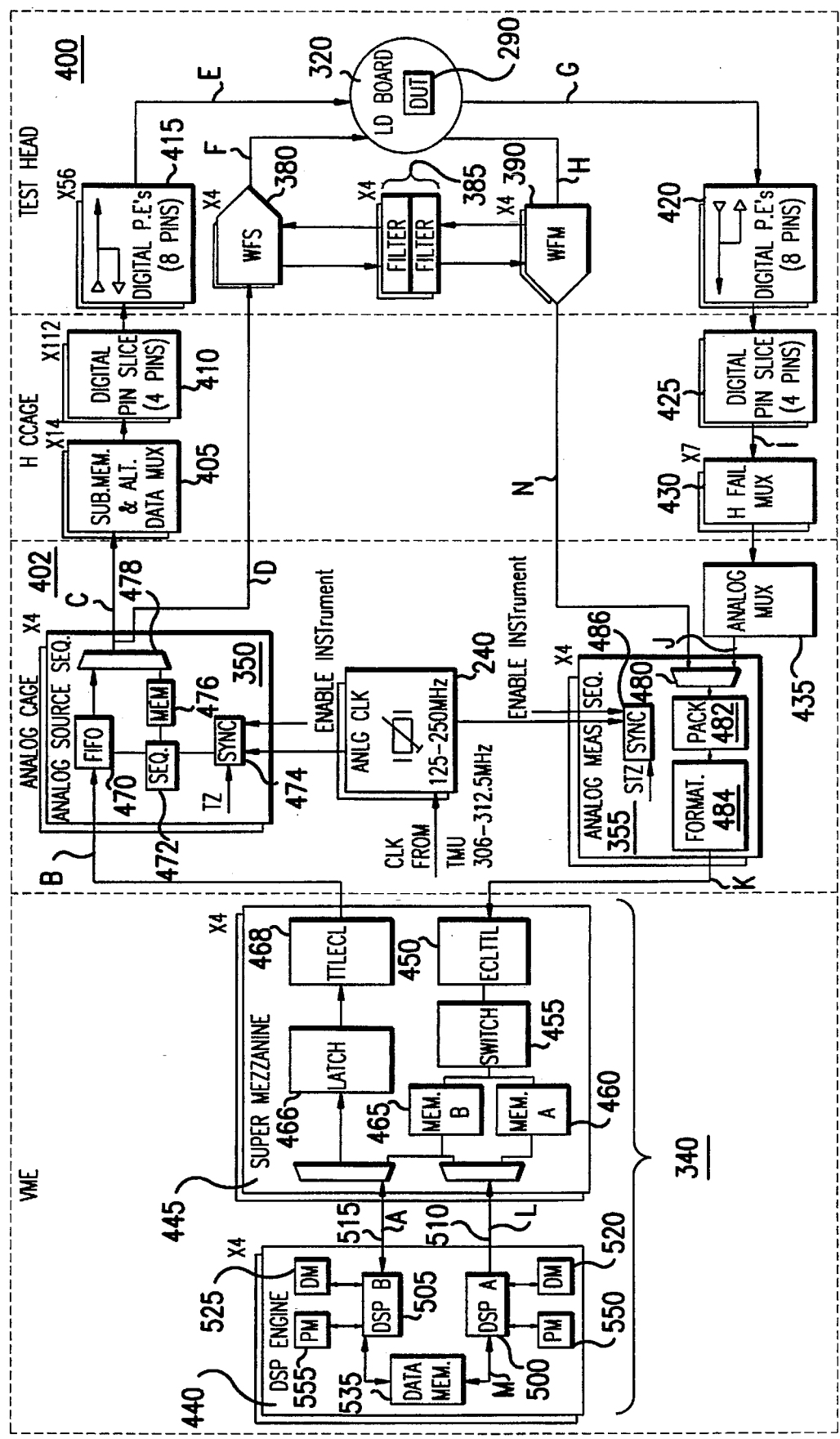
FIG. 4 is a more detailed block diagram of signal paths of the test system of FIG. 3.

FIG. 4 shows a more detailed block diagram of signal paths of the test system of FIG. 3, in which like reference numerals indicate like components. In the embodiment shown, each analog channel includes analog pin electronics (PE) cards (waveform source 380, filter module 385, and waveform measure 390), two analog sequencer cards (analog source sequencer 350 and analog measure sequencer 355), and one DSP module 340. Each channel may be optimized for a particular analog signal bandwidth and resolution. The analog PE cards are preferably located in a low-noise test head 400 with the digital PE cards.

An analog source sequencer module 350, an analog measure sequencer module 355 and a DSP processor module is provided for each channel. These modules are preferably located in a system mainframe or analog cage 402. Analog source sequencer module 350 includes a first-in-first-out memory 470, a sequencer 472, a synchronizer 474, a sequencer memory 476 and a mux 478. Analog measure sequencer module 355 includes a mux 480, a data packer 482, a data formatter 484, and a synchronizer 486. Analog source sequencer module 350 and analog measure sequencer module 355 are synchronized by clock signals of selected frequency from a per-channel analog clock signal generator 240 which can generate clock signals in a range, for example, of 125 MHz to 250 MHz. The selectable clock allows the analog channels to source and measure signals to and from the DUT at a desired frequency or data rate. For example, it may be desired to test a modem device by communicating with the device at a specified ITU-TSS (formerly CCITT) international-standard frequency.

Analog source sequencer module 350 provides run-time generation of complex waveforms which are supplied to the DUT via waveform source 380 and, optionally, via a filter 385. Analog source sequencer module 350 can also supply digital representations of analog signals through a subroutine memory and alternate-data multiplexer 405 to digital pin slices 410. The digital representations are used to drive input pins of DUT 29 through digital pin electronics 415. In one embodiment, 56 digital PE units 415 are provided in the system and the user-defined test program can select them as needed for use by the analog channels.

Data from digital PE cards 420 passes through digital pin slices 425, an "H-fail" multiplexer 430 and an "analog" multiplexer 435 to analog measure sequencer 355. Analog measure sequencer module 355 transfers data from digital PE cards 420 or waveform measure cards 390 into DSP module 340. Analog measure sequencer module 355 formats the data and transfers it to DSP module 340.

Each DSP module 340 comprises a DSP engine 440 and a "super mezzanine" 445. Data incoming from AMS 355 is passed through an ECL-to-TTL converter 450 and then through a switch 455 to one of memories 460 or 465. Data supplied from DSP engine 440 to super mezzanine 445 passes through a latch 466 and TTL-to-ECL converter 468 to analog source sequencer 350.

Figure 5:
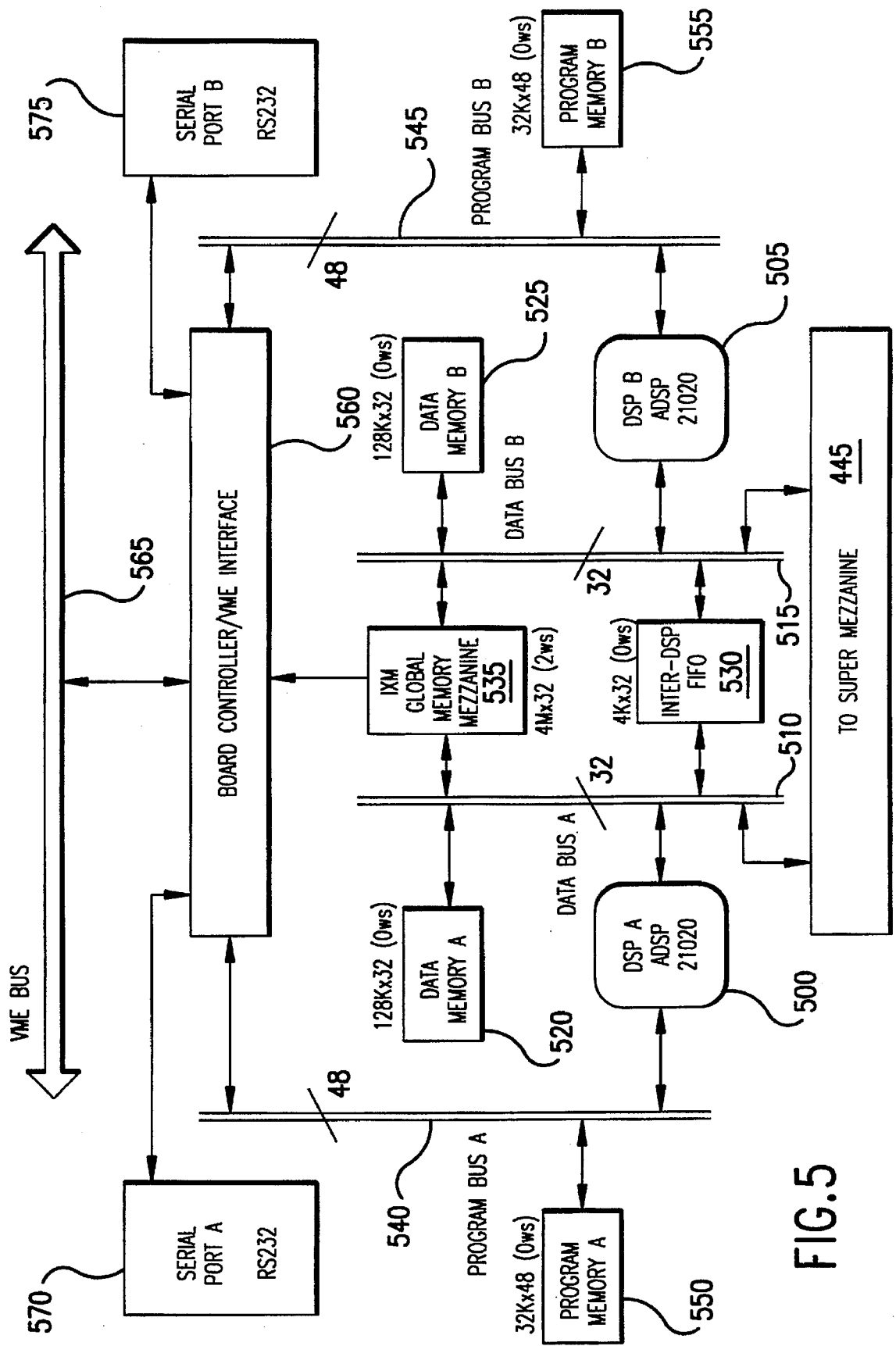
FIG. 5 shows the high-level architecture of the DSP engine of FIG. 4.

DSP engine 440 can be a commercially-available processor board such as the model IXD7232 signal processing board sold by Ixthos, Inc., of Silver Spring, Md. FIG. 5 shows the high-level architecture of the IXD7232 board. Each of a pair of digital signal processors 500, 505 communicates via a respective data bus 510, 515 with super mezzanine 445, with a respective data memory 520, 525, with an inter-DSP first-in-first-out (FIFO) memory 530 and with a global memory mezzanine 535. Each of digital signal processors 500, 505 communicates via a respective program bus 540, 545 with a respective program memory 550, 555. Program buses 540, 545 also provide communication through a board controller/VME interface 560 to a VME bus 565 and to serial ports 570, 575.

Data memory banks 520, 525 and global memory 535 are mapped into the corresponding DSP processor address space thereby allowing the DSP processor to access these elements like ordinary memory. Address generators (not shown) are accessed by the DSP processor but not by analog measure sequencer 355.

DSP-A 500 sets address generator A to a location in the address space of super mezzanine memory 460 or 465. While DSP-A 500 is reading from one bank of memory (e.g., memory 460), AMS 355 can store data in the other memory bank (e.g., memory 465). DSP-A 500 then switches banks and, while AMS 355 is writing data into the first bank (e.g., memory 460), DSP-A 500 can read data from the second bank (e.g., memory 465). If there is enough space in the memory bank for all the captures, DSP-A 500 can set address generator A so that multiple captures can be forced into a bank without fear of the high speed AMS 445 overwriting a previous capture. Once a capture is obtained in a bank of memory, the DSP can lock the AMS out to prevent it from writing data into the super mezzanine.

The input/output (I/O) methodology for AMS 355 can be controlled for two different modes: block, and real time. In block mode, only DSP-A 500 is used for processing data from AMS 355. In this mode, all banks of super mezzanine 445 are controlled by DSP-A 500. The size of the register (not shown) in DSP-A 500 which corresponds to the input data count is equal to the total memory size of super mezzanine 445. Super mezzanine 445 has a counter (not shown) which corresponds to the data size transferred. DSP-A 500 knows the base address in super mezzanine 445 from which the incoming data starts. Also, DSP-A 500 updates a pointer to the address location where the current data is being stored. DSP-A can enable and disable data address generation in super mezzanine 445, thereby cutting it off from the AMS. DSP-A 500 can also reset the super mezzanine.

Super mezzanine 445 has the capability to send an interrupt to DSP-A 500 at the end of the input block of data. Super mezzanine 445 has the capability to generate an interrupt to DSP-A 500 after a specified number of input blocks of data. Super mezzanine 445 can switch between memory banks 460, 465 when one bank is full without any loss of data. Super mezzanine can be set up so as to switch over to the next bank after receiving a particular block size.

Block mode. Based on the size of the capture for the current test, DSP-A 500 sets a transfer counter in super mezzanine 445 according to the data specified in the test program. When super mezzanine 445 receives a data block (also known as a record) from AMS 355 corresponding to the size specified in the transfer counter, super mezzanine 445 generates an interrupt to DSP-A 500. DSP-A 500 can configure super mezzanine 445 so that the interrupt is generated only after a certain number of input blocks from AMS 355. When DSP-A 500 receives the interrupt from super mezzanine 445, it starts processing the data in the memory banks. DSP-A 500 cannot access the bank into which AMS 355 is writing data. In addition, DSP-A 500 can set up the necessary registers for the next input from AMS 355 while AMS 355 is writing data. In this mode, DSP-A 500 has access to all banks except the one which is being accessed by the AMS 355.

FIGS. 6 and 7 show super mezzanine (SM) 445 in block mode of operation. In FIG. 6, AMS 335 is writing to memory bank 460 while DSP-A 500 reads data from memory bank 465. A register 600 in SM 445 holds a value "Xferlen" representing the size of input block, e.g., 1024 bytes, and a value "Xfercount" representing the count of data transferred from AMS 335 to bank 460. In FIG. 6, DSP-A 500 has set up the registers to accept data from AMS 335. While AMS inputs the data into bank 460, DSP-A 500 cannot access data in bank 460, but DSP-A 500 does set up the registers for the next input. At the end of the specified transfer length, SM 445 sends an interrupt to DSP-A 500. DSP-A 500 then changes the access of AMS 335 from bank 460 to bank 465 as shown in FIG. 7. Since the necessary registers were already set up by DSP-A 500, there will not be any data loss. At this point, DSP-A 500 processes the data in bank 460 while AMS 335 fills up bank 465.

Real-Time Mode. In real-time mode of operation, data is transferred continuously from AMS 335 to DSP-A 500.

A preferred mixed-signal test system in accordance with the invention as described herein is based on and makes use of digital subsystems of the Schlumberger ITS 9000FX digital test system. That digital test system is described, for example, in *Schlumberger ITS 9000FX Hardware Reference Manual*, Publication Number 57010045, Revision 4, ECO 17313, August 1993, published by Schlumberger Technologies Inc., San Jose, Calif., the content of which is incorporated herein by this reference. The ITS 9000FX system includes a software environment known as "ASAP" (for Advanced Symbolic ATE Programming) which simplifies setup and programming of tests. To address mixed-signal test requirements, low-noise power and ground distribution are provided, an analog subsystem and instrument set are added, and the ASAP software environment is extended to provide tools for control of mixed-signal test hardware.

Figure 8:
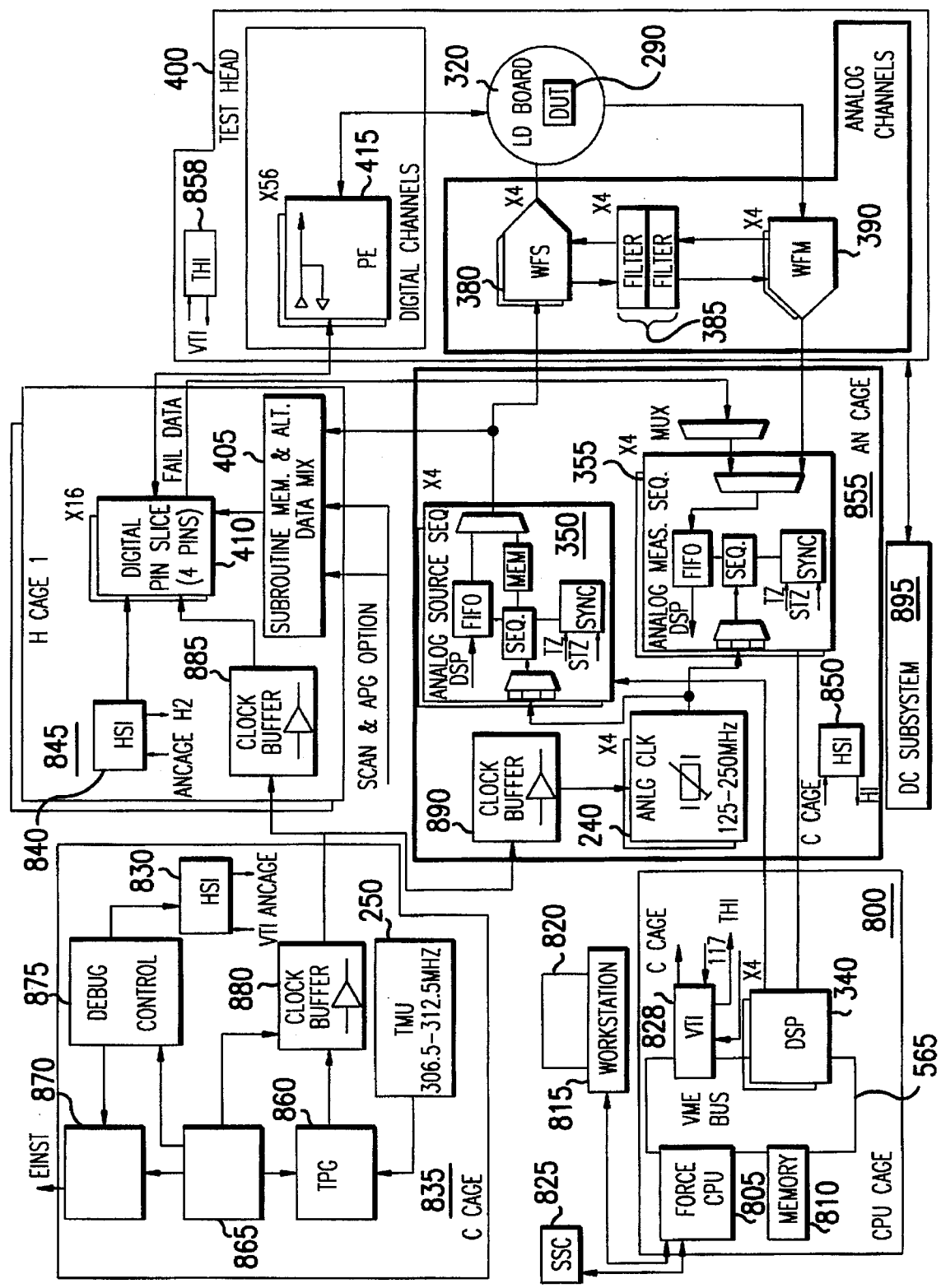
FIG. 8 is a block diagram showing overall architecture of a mixed-signal test system in accordance with the invention.

FIG. 8 is a block diagram showing overall architecture of a mixed-signal test system embodiment in accordance with the invention which is based on the ITS 9000FX system. DSP module 340 is housed in a CPU cage and communicates via VME bus 565 with a central processing unit (such as a Sparc-processor-based "Force" CPU) 805, and memory 810. CPU 805 also communicates with a workstation 815 having a screen 820 and input/output devices (not shown) for user programming and control of the test system. CPU 805 also communicates with a system status controller (SSC) 825. A VME to tester interface (VTI) 828 allows communication over a high-speed bus between elements attached to VME bus 565 and high-speed interface (HSI) modules located in other card cages, e.g., via HSI 830 in control (C) cage 835, HSI 840 in high-speed-pin (H) cage 845 (and via such HSI units in the other six H-cages), and via HSI 850 in analog (AN) cage 855. The C-cage interfaces to all the high speed pin slice cards providing global timing and address generation. In addition to the HSI, each H-cage is fitted with a clock buffer card and up to 16 pin slice cards. Each pin slice card controls 4 test head channels. Two subroutine memory and alternate data mux (SMADM) modules per H cage can be fitted to control 32 channels each.

VTI 828 also allows communication over a test-head bus between elements attached to VME bus 565 and a test-head interface (THI) module 858 in the test head, e.g., for communicating setup information from CPU 805 to the various elements of the analog channel prior to test and for retrieving information after test. Time measurement unit 250 supplies a digital clock signal at a selected frequency to a test-period-generator (TPG) circuit 860. A main sequence control memory (MSCM) 865, instruction decoder 870, debug controller 875 and clock buffer 880 are also contained in control (C) cage 835. Clock buffers 885 and 890 are also provided in H-cage 845 and AN-cage 855, respectively. Controllable subroutine memory and alternate data multiplexer 405 can select and store digital patterns from analog source sequencer 350 or from other optional (SCAN and automatic-program-generator (APG) pattern sources). A direct-current (DC) subsystem 895 is provided for measurement of DC characteristics of the DUT.

Figure 9:
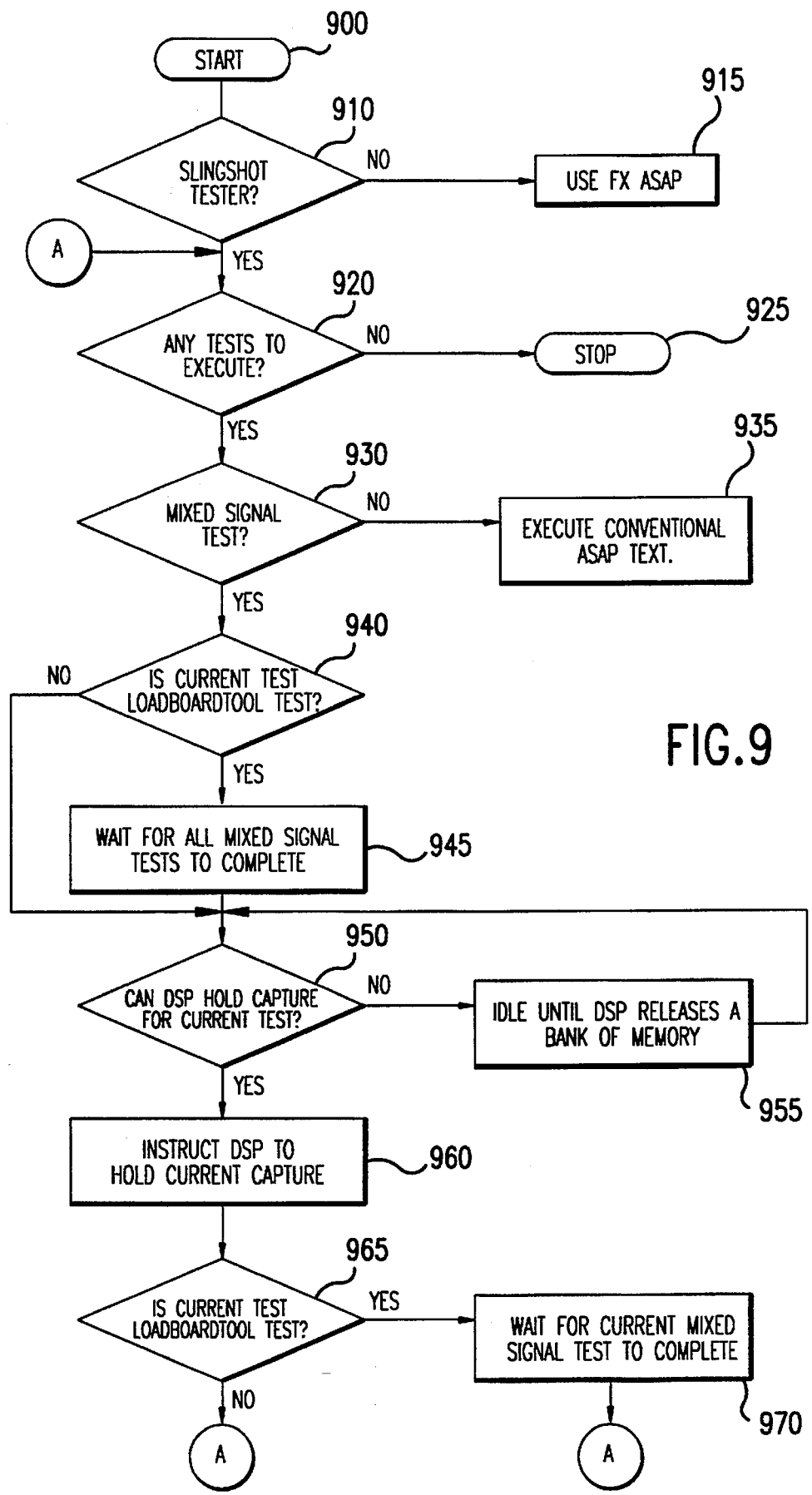
FIG. 9 is a flow chart of a scheduler program running in the tester processor for controlling high-level operation of a test system in accordance with the invention.

FIG. 9 is a flow chart of a scheduler program running in the tester processor (e.g., CPU 805) for controlling high-level operation of such a test system. Operation starts at block 900. In block 910, the program checks whether the tester is equipped for mixed-signal testing ("Slingshot tester?"). If no, the scheduler assumes a digital test is to be conducted and proceeds at step 915 to use the ITS 9000FX digital tester's "ASAP" software environment for a digital test. If yes, the scheduler determines at step 920 whether any tests are awaiting execution. If no, the scheduler stops operation at step 925. If yes, the scheduler determines at step 930 whether a mixed-signal test is to be conducted. If no, the scheduler proceeds at step 935 to execute a digital test using the "ASAP" software environment. If yes, the scheduler checks at step 940 whether the test to be performed is to be controlled by a software tool termed the "Loadboardtool." If the test to be performed is to be controlled by the Loadboardtool, the scheduler waits at step 945 for all mixed signal tests to complete and then checks at step 950 whether the DSP can hold capture data for the current test. If no, the scheduler remains idle at step 955 until the DSP releases a bank of memory. If yes, the scheduler instructs the DSP at step 960 to hold the current capture data. The scheduler then tests at step 965 whether the current test is controlled by the Loadboardtool software. If no, the flow proceeds to step 920 (marker "A"). If yes, the scheduler waits at step 970 for the current mixed-signal test to complete and then proceeds to step 920 (marker "A"). When no further tests remain to be executed, the scheduler stops operation at step 925.

Figure 10:
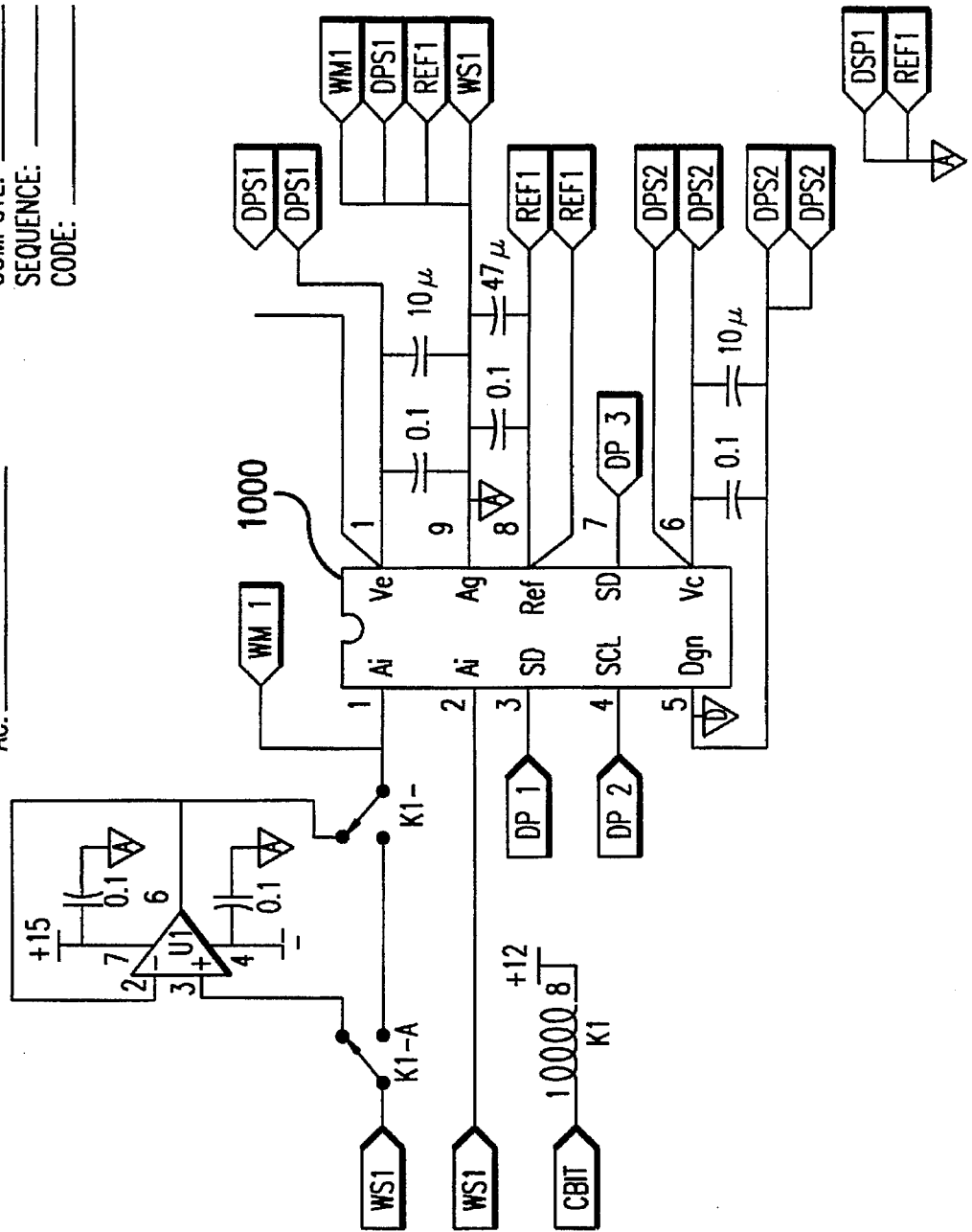
FIG. 10 is a functional display of a user-interface for configuring a test system in accordance with the invention.

Loadboardtool is a software interface offering ready user access to the functional and physical analog capabilities of the tester. It provides for execution of the mixed signal test, monitor of test status, and control of instruments involved in the test. FIG. 10 is a functional display such as the user would see on display 820, in which a representation of a DUT 1000 and its pins is shown. Also shown are representations of instruments which the user has functionally connected to pins of the DUT by manipulation of the display with a pointing/selecting device such as a mouse. For example, a waveform source WF1 and waveform measure WM1 are connected to DUT pins 1 and 2; a digital pattern source DP1 is connected to DUT pin 3; another digital pattern source DP2 is connected to DUT pin 4, etc. The display shows the current state of the loadboard relays, which is determined by the state of relay control ('C' bits) and other test parameters which the user sets up. Once the setup is completed, the Loadboardtool software invokes other ASAP tools as needed to implement the test (e.g., tools for setting patterns, timing, levels, DC values, and the like).

Through Loadboardtool, the user can also invoke specialized software tools for computation, signal source and measure, Cbits control, analog clock control, waveform generation and measure, reference, productivity, specification summary, system status, and sequencing. Each of the tools which controls specific hardware preferably displays a block diagram of the hardware and indicates what parts of the block diagram can be changed by the user.

Figure 11:
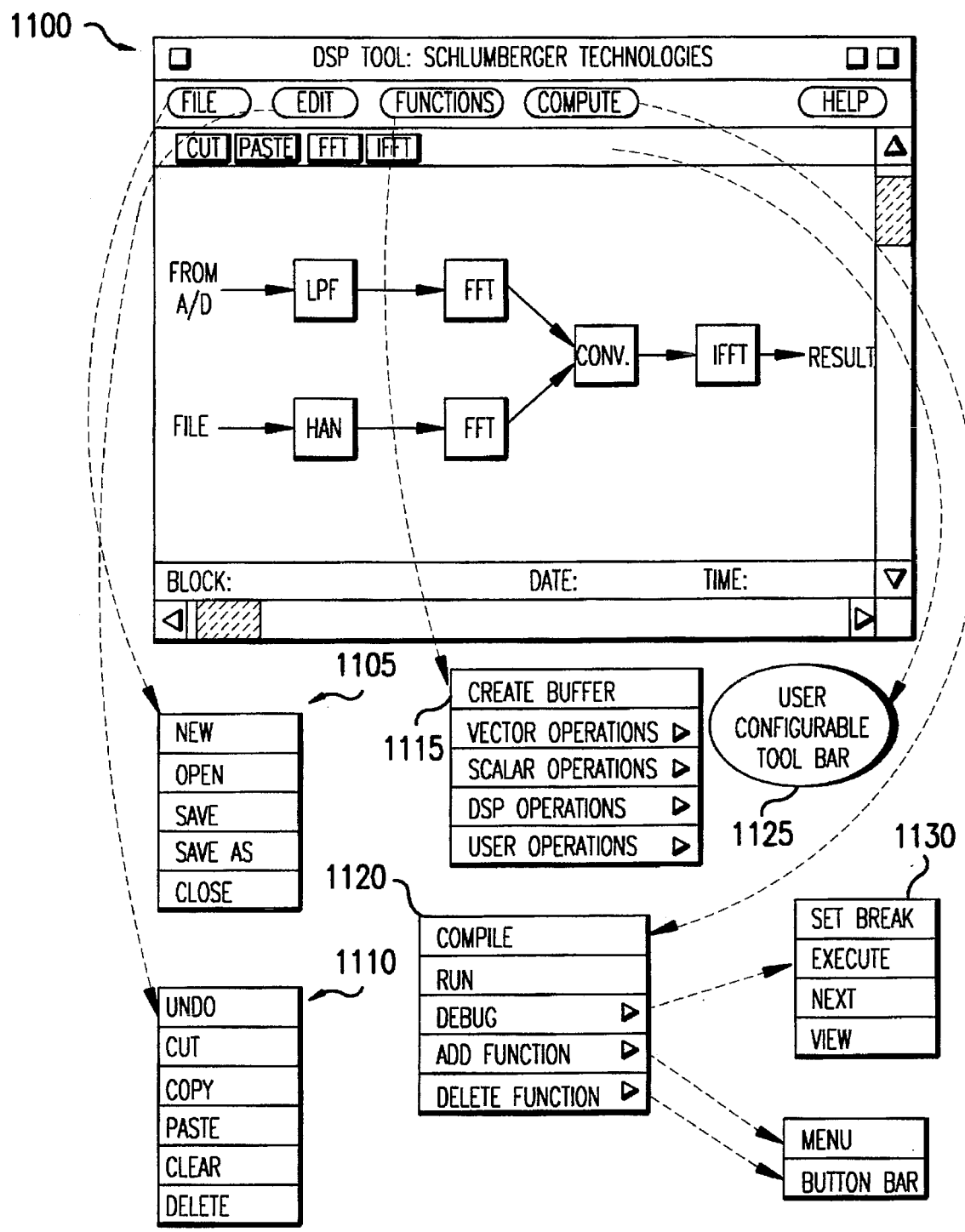
FIG. 11 is a display of a further user-interface for configuring a test system in accordance with the invention.

A "DSPTool" enables the user to program the DSPs for performing the appropriate transfer functions. A graphic interface is provided, as shown for example in FIG. 11, along with standard library functions and user-coded functions for programming the DSPs. This tool also provides the user with the ability to describe closed loop tests and, during program debug, the ability to set breakpoints on functions and to display array data. FIG. 11 shows at 1100 a sample screen display of DSPTool. A menu of file functions is shown at 1105, a menu of edit function is shown at 1110, a menu of operational functions is shown at 1115, a menu of compute functions is shown at 1120, and a user-configurable tool bar is shown at 1125. A menu of debug functions is shown at 1130. Each of the menu items can be selected by the user with the aid of a mouse or keyboard to invoke desired system capabilities.

Figure 12:
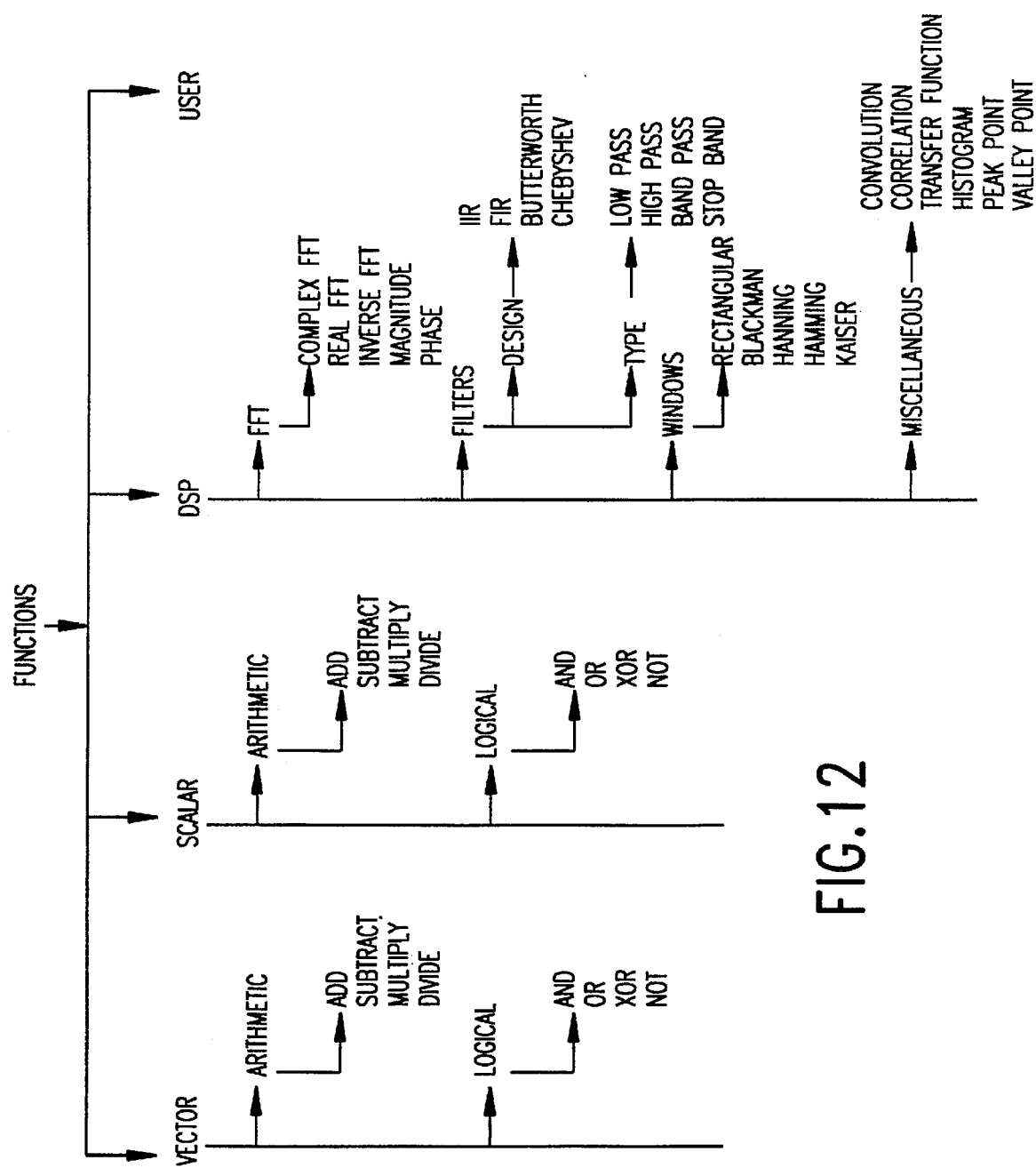
FIG. 12 shows a menu hierarchy of operational DSP functions of a test system in accordance with the invention.

FIG. 12 shows the menu hierarchy of operational functions including a wide range of standard library functions categorized as vector, scalar and DSP, as well as user-defined functions. The DSP functions include algorithms for well-known operations such as computing a Hanning window, performing a complex Fast Fourier Transform (FFT), and computing a time-domain autocorrelation.

A sample user-defined sequence of operations is displayed in FIG. 11, in which the signal from an A/D converter is to be passed through a low-pass filter (LPF), a signal from a stored file is to be subjected to a Hanning window operation. The results of these two operation are each subjected to a fast Fourier transform (FFT), convolved (CONV) and then subjected to inverse fast Fourier transform (IFFT) to produce the desired result. By constructing a diagram as in FIG. 11 the user can setup a desired sequence of operations without detailed knowledge of the system operation. The ASAP software environment generates a detailed test program from the user-created graphical representation of test flow.

Figure 13:
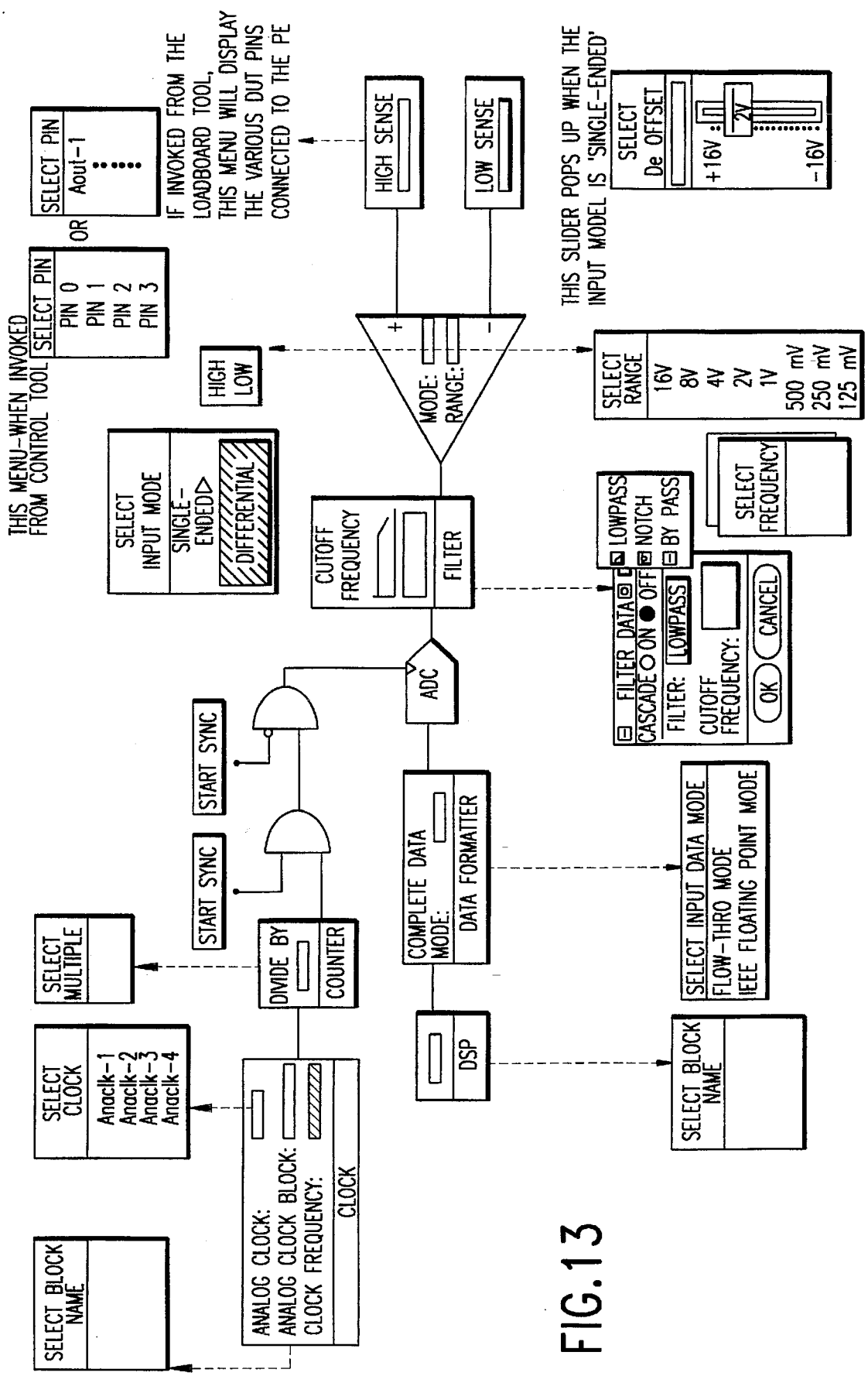
FIG. 13 is a display of a user-interface which having blocks prompting the input of parameters to set up an analog channel for a high-accuracy waveform measurement in accordance with the invention.

A "MeasureTool" enables the user to program the measure instrumentation. MeasureTool allows selection of one of several modes: HAWM (high-accuracy waveform measure), HFWM (high-frequency waveform measure), or digital pin. In each mode, the appropriate circuit diagram and the measure sequencer diagram are displayed. The display includes blocks prompting the user to set the parameters. An example of a MeasureTool HAWM diagram is shown in FIG. 13. The major functionality of the Measure-Tool in the HAWM mode is to set the audio filter, set the appropriate high accuracy measure options, and provide an option to measure the voltage outputs of the waveform measure instrument using the multimeter. The major functionality of the MeasureTool in the HFWM mode is to set the appropriate high frequency measure options, set the video filter, and provide an option to measure the voltage outputs of the waveform measure instrument using the multimeter. The major functionality of the MeasureTool in the digital pin mode is to map the digital pins in the measure sequencer by controlling the HCAGE bitmap mux and the Analog measure mux. The analog measure sequencer hardware is also controlled with MeasureTool. The major functionality of the analog measure sequencer interface is to allow the user the choice of data routing either sent directly to the DSP or through the analog measure sequencer to the DSP, and to provide an interface to the following parameters: Waveform Evaluation block, clock source, clock frequency, start & stop triggers, data formats and data capture mode.

Figure 14:
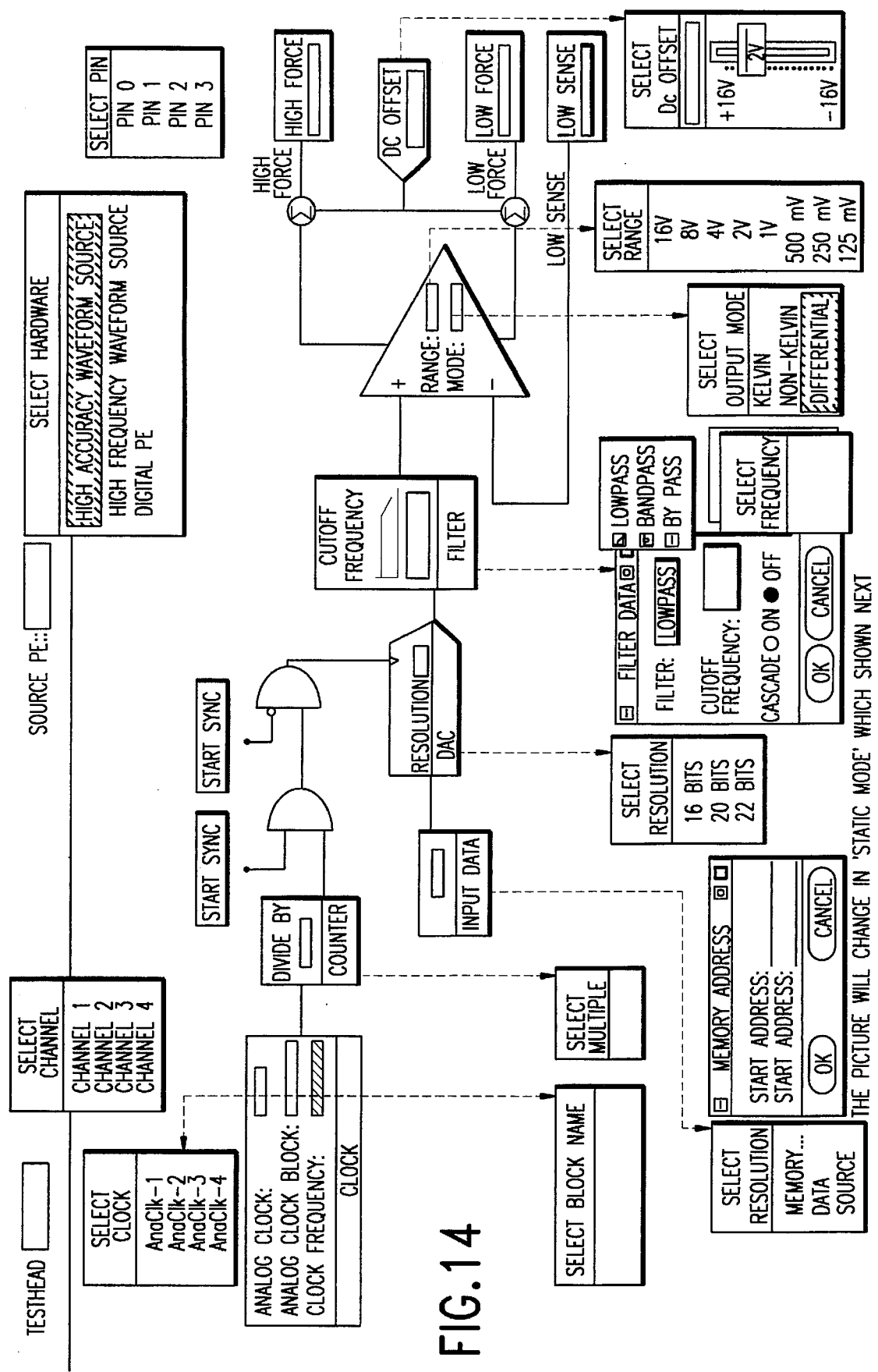
FIG. 14 is a display of a user-interface which having blocks prompting the input of parameters to set up an analog channel for a high-accuracy waveform sourcing in accordance with the invention.

A SourceTool provides the user with techniques of sourcing the analog waveform/sampled data to the DUT. Depending on the settings of the hardware in the LoadboardTool, the appropriate instrument circuit diagram will be displayed in this tool. The WaveformTool can be invoked from this tool for waveform creation. The SourceTool works in one of three modes, either HAWS (high-accuracy waveform source), HFWS (high-frequency waveform source), or digital pin. In each mode, the appropriate circuit diagram and the source sequencer diagram are displayed. FIG. 14 shows an example of a SourceTool HAWS diagram display. The major functionality of the SourceTool in the HFWS mode is to set the appropriate high frequency source options and the video filter. The major functionality of the SourceTool in the digital pin mode is to map the digital pins in the source sequencer. The analog source sequencer hardware is also controlled with the SourceTool. The major functionality of the analog source sequencer interface is to allow the user the choice of bypassing the analog source sequencer hardware when sourcing the data from the DSP to the DUT, and to provide an interface to the following parameters: the waveform generation block, the clock source, the clock frequency and the start and stop triggers.

Other user-accessible software tools are also preferably provided. For example, a ReferenceTool permits user control of the reference source, and displays a function representation of the circuit diagram. A WaveformTool provides a method of creating graphic representations of waveforms to be generated. A CbitsTool controls the 'C' bit relays, displaying a block diagram of all loadboard user-relay hardware and indicating what parts can be changed by the user. An AnalogClockTool assists user manipulation of the analog clocking and jitter source hardware of the tester, displaying diagrams of the analog clocking and jitter source hardware, controlling the master clock, and indicating which parts of the diagram can be changed by the user. A SequenceTool allows the user to specify the order of tester activities that are performed during a mixed signal test.

The described graphical software tools are preferably used to simplify system setup by the user, though the setup could just as well be performed by other well-known means such as direct generation of a test program by the user. Once the setup is defined by the user, CPU 805 passes the setup and control and sequencing information to the system's hardware modules via VTI 828, the HSI units in the C-cage, H-cages and AN-cage, and via THI 858. The availability of multiple analog channels with source and measure instruments which can be flexibly configured in this way allows the system to efficiently perform a wide range of mixed-signal tests, examples of which are described with reference to FIGS. 30–32.

Figure 15:
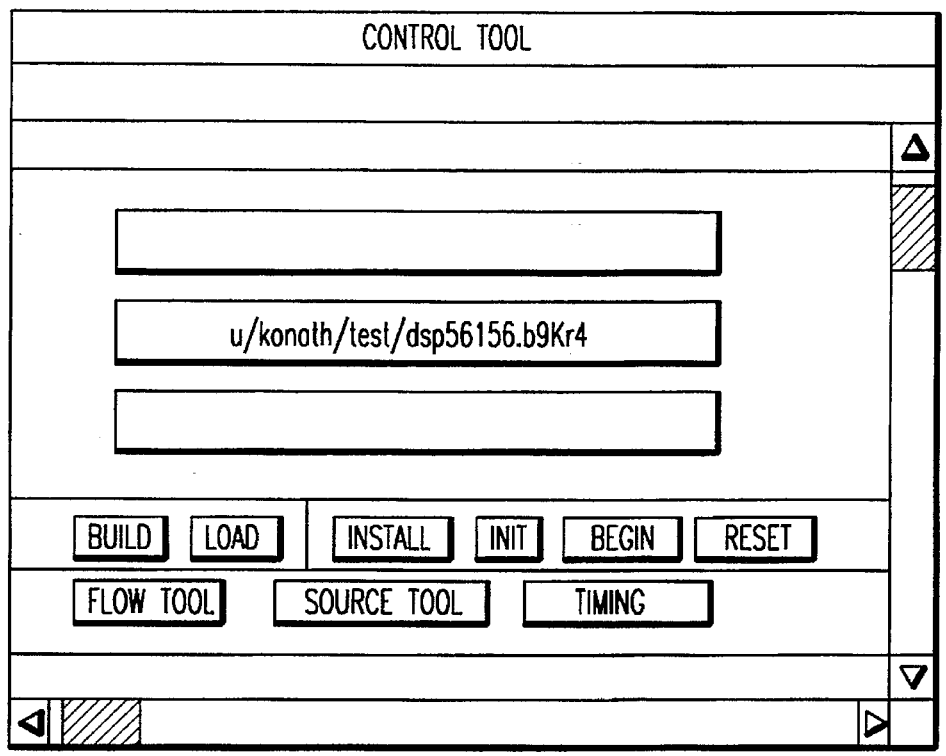
FIGS. 15–20 show graphic displays illustrating features of software tools useful in controlling a tester in accordance with the invention.

FIG. 15 shows a graphic display of a ControlTool software tool useful in controlling test setup and operation. The display appears in a "window" of a display screen of workstation 200, for example, and includes an block for user-entry of a test program name (e.g., "u/konath/test/dsp/56156.b9kr4") and "buttons" which can be selected by use of a control device (e.g., a "mouse" or other point-and-click device) to activate the named functions: build, load, install, init, begin, reset, Flowtool, SourceTool, Timing.

Figure 16:
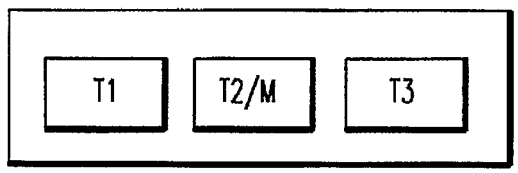
Figure 17:
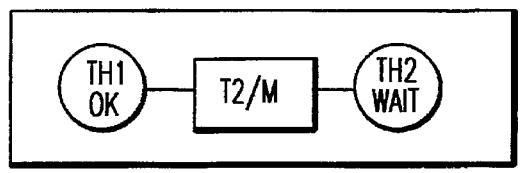
Figure 18:
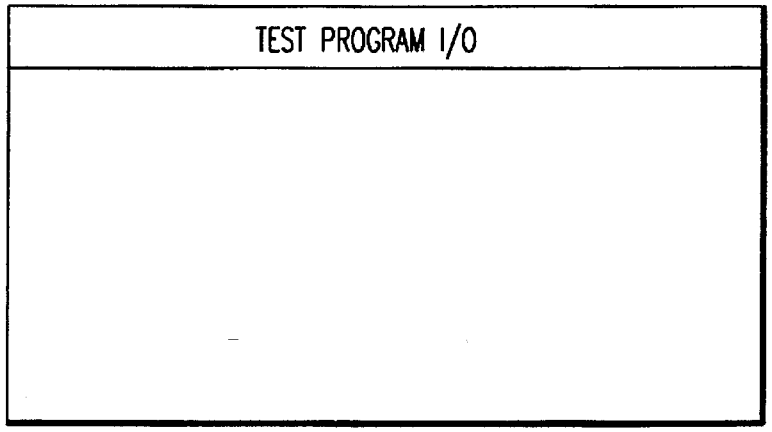

FIG. 16 shows a sub-window of the ControlTool display in which are shown icons representing test systems T1, T2/M and T3 connected to and controllable through workstation 200. Testers T1 and T3 are in this example digital testers (e.g., standard ITS 9000FX test systems), while Tester T2/M is a mixed signal tester as described herein. User selection of the "T2/M" icon causes a further display as in FIG. 17 to appear, in which a block labeled "T2M" is shown attached to indicators representing respective test heads of the mixed-signal tester. In the example shown, the indicator for test-head #1 "TH1" indicates that the test head is available for use, while the indicator for test-head #2 shows that the test head is unavailable at the moment. By selecting the indicator labeled "TH1" the user instructs the system to prepare for operations with test-head #1. When the user enters a test program name and selects the "Load" icon (see FIG. 15), a Test Program I/O window as shown in FIG. 18 is displayed to indicate the status of test program operations, e.g., "test program loading," "test program loaded," etc.

Figure 19:
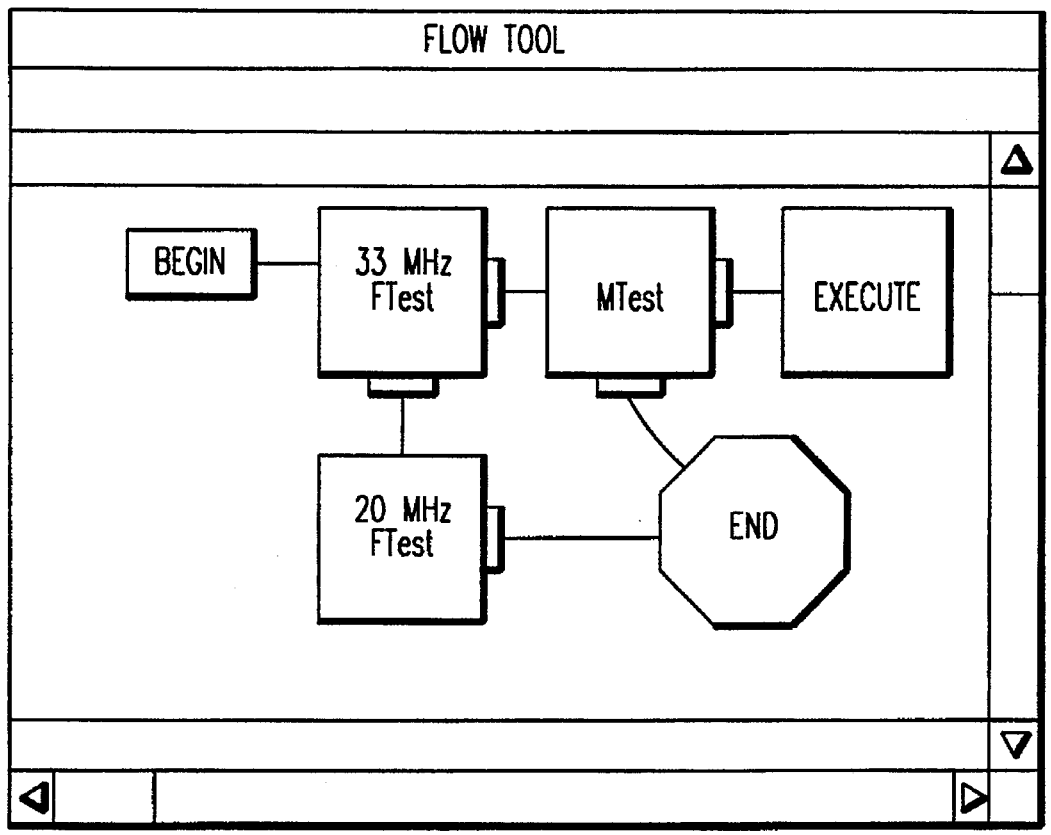

By selecting the "FlowTool" icon of FIG. 15, the user can activate a "FlowTool" display window as shown in FIG. 19. The FlowTool display aids the user in defining the flow of a test using the "ASAP" tools of the ITS 9000FX test system. In the simple example of FIG. 19, the test begins at a block marked "begin" and proceeds to a "33 MHz FTest" segment which conducts functional digital tests of the DUT at a 33 MHz clock speed. If the 33 MHz test is passed, the test flow continues with a mixed-signal "MTest" segment. Otherwise, the test flow continues with a "20 MHz FTest" segment, etc. If a single test segment, e.g., "MTest" segment, is to be executed, the user can select the corresponding icon from FIG. 19 to obtain a sub-window display as in FIG. 20 having a button to be selected for executing only that segment. Execution of a single segment or of a selected group of segments can be useful in debugging a test as the test is being developed.

The ASAP runtime execution environment is composed of a test program process and supporting processes on the tester CPU. Test Data Control (TDC) software provides data transferring interface and supports event notification for the runtime process, which is implemented on top of the UNIX TCP/IP socket-based communication protocol. A TDC process running on tester computer 210 includes statements to handle analog runtime service requests, such as: configure analog subsystems ("load"), install analog hardware ("install"), initialize analog hardware ("init"), execute analog tests ("execute"), manage DSP results, and operate analog data blocks.

Figure 21:
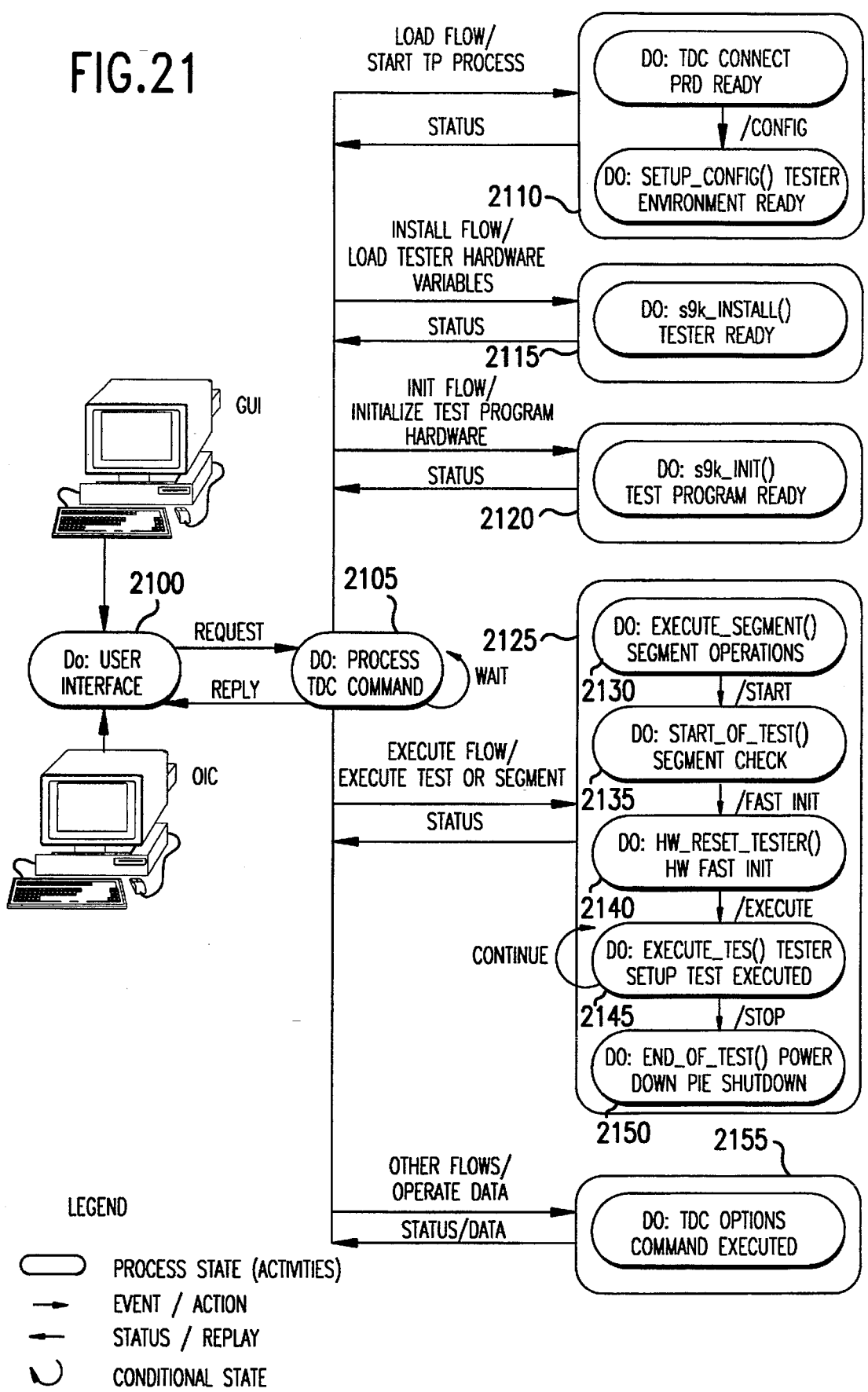
FIG. 21 shows a state diagram for runtime operation of a mixed-signal tester in accordance with the invention.

FIG. 21 shows a state diagram for runtime operation of a mixed-signal tester in various flows in accordance with the invention. As the runtime execution process is based on an event-driven state model, a state diagram technique describes runtime flows. A flow is an aggregate of events, states, activities, and results. The runtime process control provides functions for manipulating the analog sub-systems within an ASAP environment. Portions of the flow are shown in sub-state diagrams of FIGS. 23–29 to show more details of a specific flow, the events that cause the state change, and the activities that result from a state change. A solid oval represents an initial state and optional conditions. A dotted line partitions concurrent states.

The user provides instructions through workstation 200, by means of graphical user interface (GUI) techniques such as described above or operator interface console (OIC) techniques such as direct entry of commands through a keyboard. An event can occur as GUI or OIC users request runtime services or the execution process detects an event (such as that datalogging is needed or any system fatal error has happened or test results are ready for further processing, etc.), during a runtime execution cycle. A state that is established by an event controls the runtime process activities. An activity associated with a Test Program state is the runtime operation. A result that is generated based upon the runtime process's activities is the reply for a specific request (an event).

Figure 23:
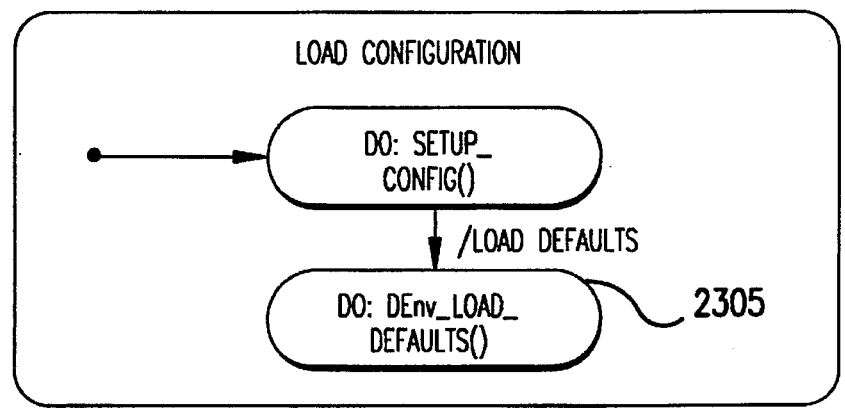
FIG. 23 shows a "load" sub-state diagram for configuring analog elements of a mixed signal tester in accordance with the invention.

Load Flow. The runtime process receives a TDC operation message with message type of TDC_SETUP_CONFIG from TDC facility at 2105 if the user requests a load service by (1) selecting the "load" button of a Control-Tool display or (2) typing a LOAD command. After the runtime process accepts this operation message, it will initiate the "Load" state, at 2110. FIG. 23 shows a sub-state diagram of activities of a "Load" state. System configuration setup is then performed, e.g., by entering default setup information in a configuration file for the test head(s) and DSPs at 2305.

Figure 24:
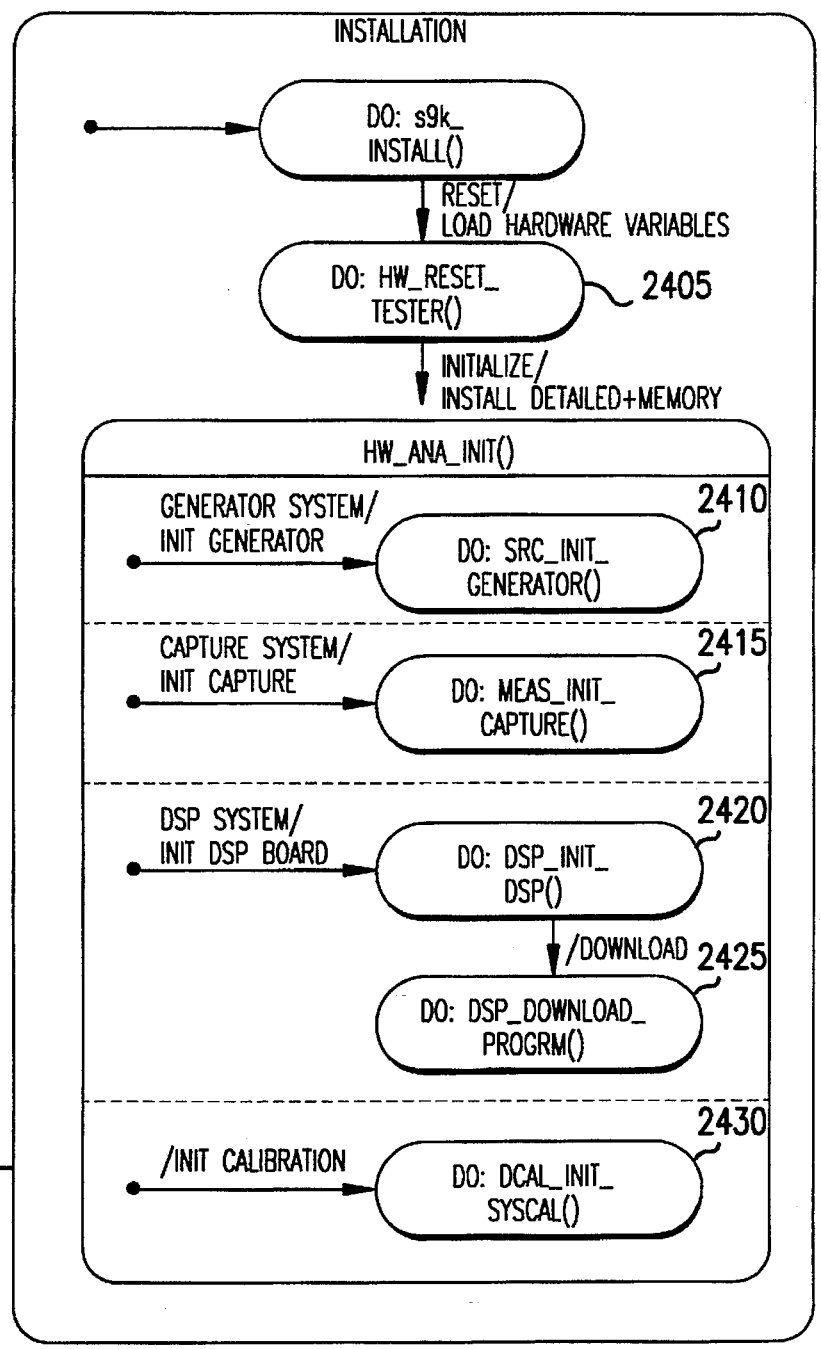
FIG. 24 shows an "install" sub-state diagram for initializing hardware elements of a mixed signal tester in accordance with the invention.

Install Flow. The runtime process receives a TDC operation message with message type of TDC_INSTALL from the TDC facility if a user requests an install service by (1) selecting the "install" button of a ControlTool, (2) executing a pre-defined INSTALL segment from a FlowTool, or (3) typing an INSTALL command. After the runtime process accepts this operation message, it will initiate the "Install" state, at 2115. FIG. 24 shows a sub-state diagram to describe analog activities of an "Install" state. These include resetting and loading hardware variables at 2405 (e.g., loadboard calibration values), initializing generator (source) hardware at 2410 (e.g., loading patterns into pattern memory), initializing capture (measure) hardware at 2415, initializing the DSP at 2420, downloading a program to the DSP at 2425, and performing analog system calibration at 2430.

Figure 25:
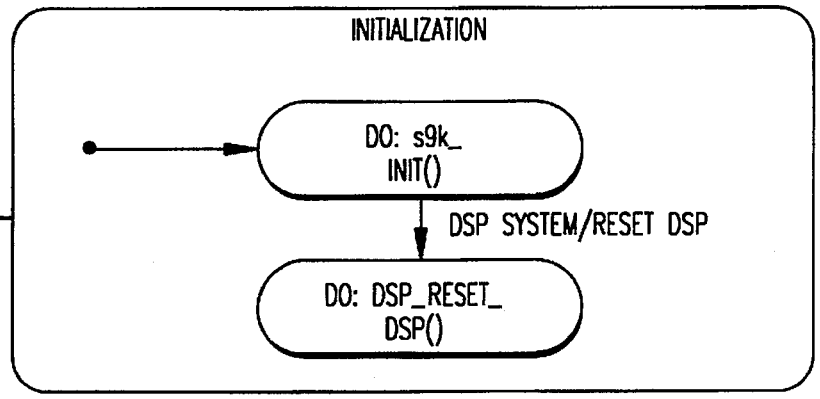
FIG. 25 shows an "init" sub-state diagram for initializing analog elements of a mixed signal tester in accordance with the invention.

Init Flow. The runtime process receives a TDC operation message with message type of TDC_INIT from the TDC facility if the user requests an initialization service by (1) selecting the "init" button of a ControlTool display, (2) executing a pre-defined INIT segment from a FlowTool or (3) typing an INIT command. After the runtime process accepts this operation message, it will initiate the "Init" state, at 2120. FIG. 25 shows a sub-state diagram of the analog activities on a "Init" state, in which each element of the analog-channel hardware is placed in a known state and the DSP units are reset.

Figure 20:
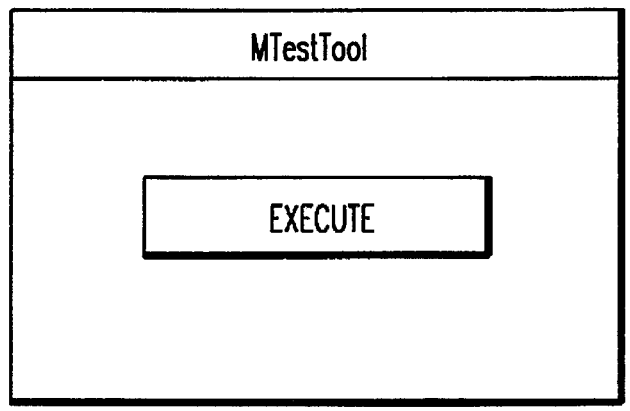

Execute Flow. The runtime process receives a TDC operation message with message type of TDC_EXECUTE from the TDC facility if the user requests an execute-test service by (1) selecting the "execute" button of a test tool, e.g., as shown in FIG. 20, (2) executing a segment from a FlowTool, e.g., as shown in FIG. 19, or (3) typing an EXECUTE command. After the runtime process accepts this operation message, it will initiate the "Execute" state, at 2125. Shown at 2125 of FIG. 21 is a sub-state diagram including "execute_segment" 2130, "start_of_test" 2135, HW_reset_tester 2140 (hardware fast initialization), "execute_test" 2145 which is repeated until all tests of the test flow are executed, and "end_of_test" 2150 which stops the test operation. Other flows can also be provided as required, as indicated at 2155.

Figure 26:
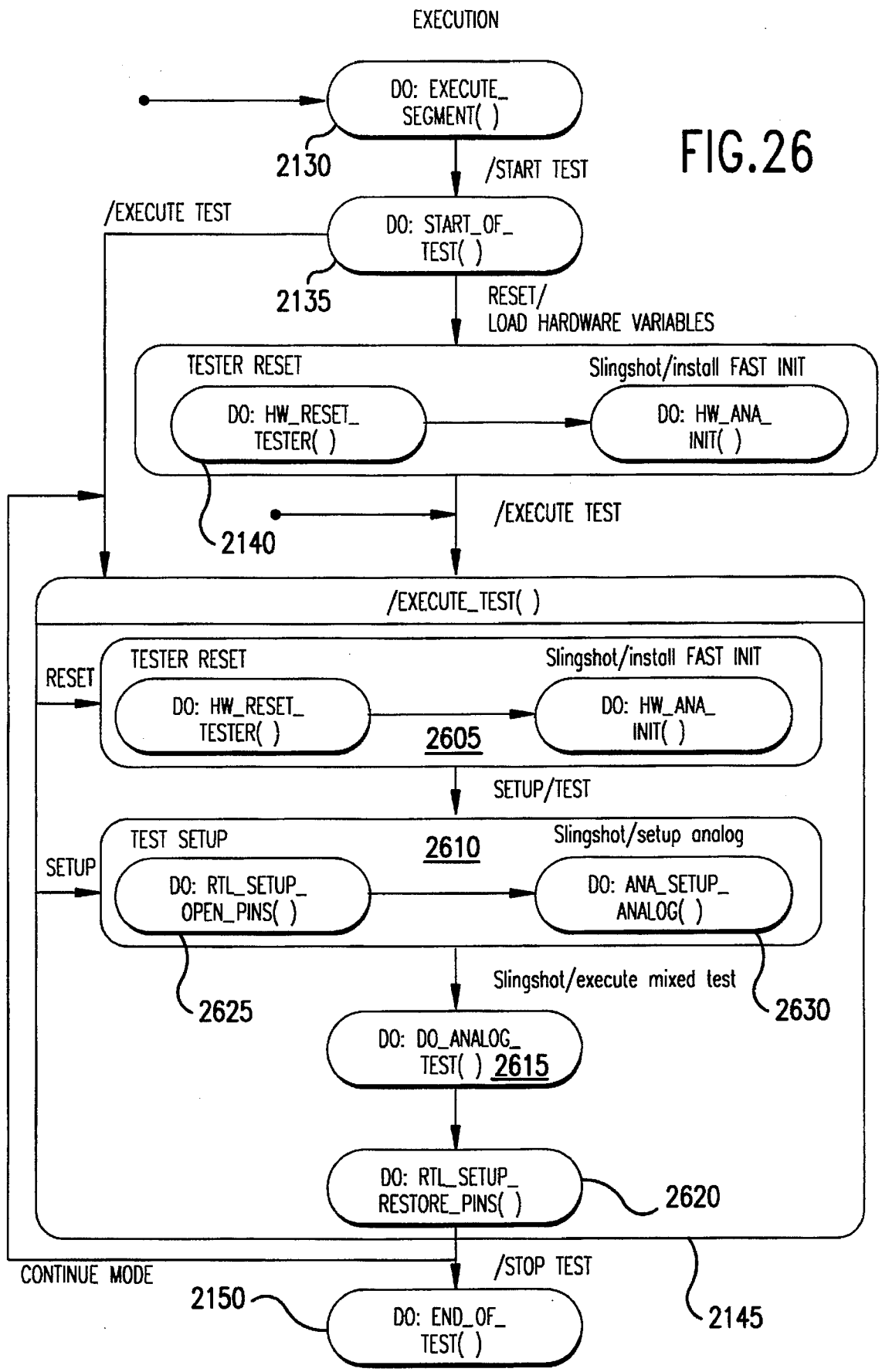
FIG. 26 shows a first "execute" sub-state diagram of analog elements in execution of a test in a mixed signal tester in accordance with the invention.
Figure 27:
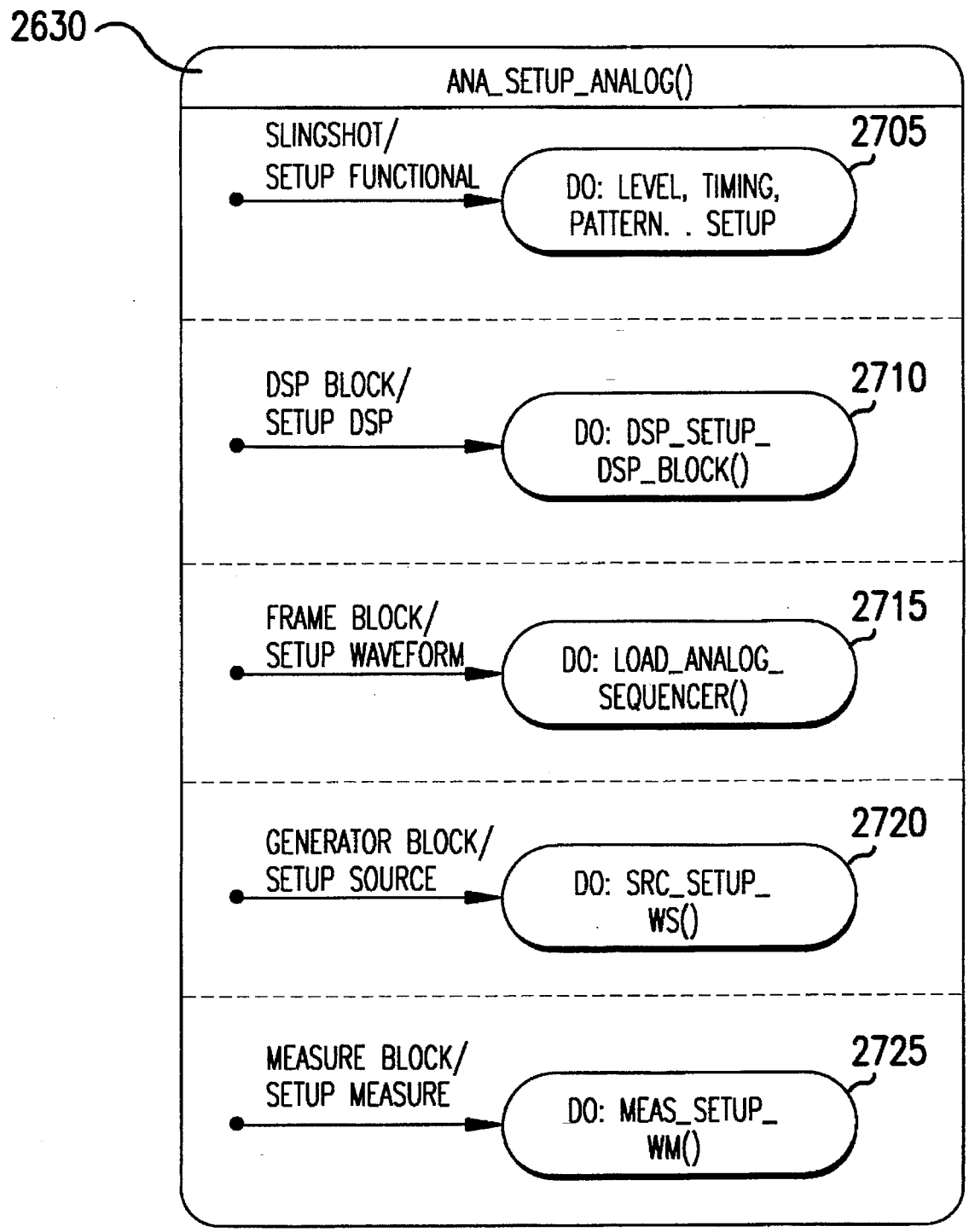
FIG. 27 shows a second "execute" sub-state diagram of analog elements in execution of a test in a mixed signal tester in accordance with the invention.

FIGS. 26–29 show sub-state diagrams of the "Execute" state. FIG. 26 shows more detail of the "continue" mode of the "execute_test" state 2145, in which the tester is reset at 2605, the test is setup at 2610, the mixed-signal test is executed at 2615 ("do_analog_test"), the digital pin electronics are reset at 2620 ("RTL_setup_restore_pins"), and the sequence of states 2605-2620 continues until all tests of the flow are executed. Test setup at state 2610 includes sub-states to setup digital pin electronics at 2625 ("RTL_setup_open_pins") and to setup the analog channels at 2630 ("ana_setup_analog"). FIG. 27 shows a sub-state diagram of the analog-channel setup state 2630, including functional setup of the test instruments at 2705 ("level, timing, pattern ... setup"), DSP setup at 2710, sequencer waveform setup at 2715 ("load_analog_sequencer"), waveform source setup at 2720 ("src_setup_ws"), and waveform-measure setup at 2725 ("meas_setup_wm").

Figure 28:
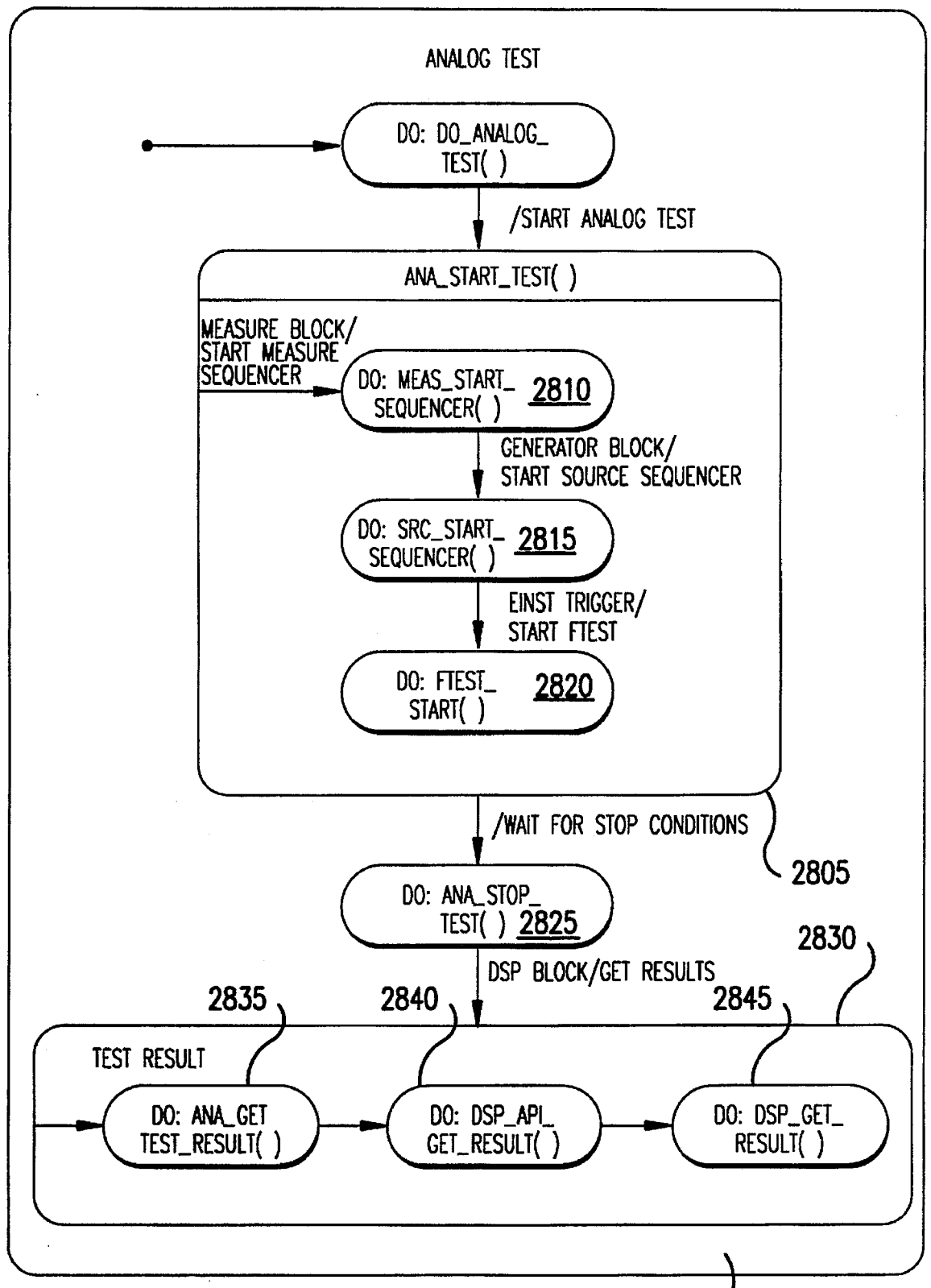
FIG. 28 shows a third "execute" sub-state diagram of analog elements in execution of a test in a mixed signal tester in accordance with the invention.
Figure 29:
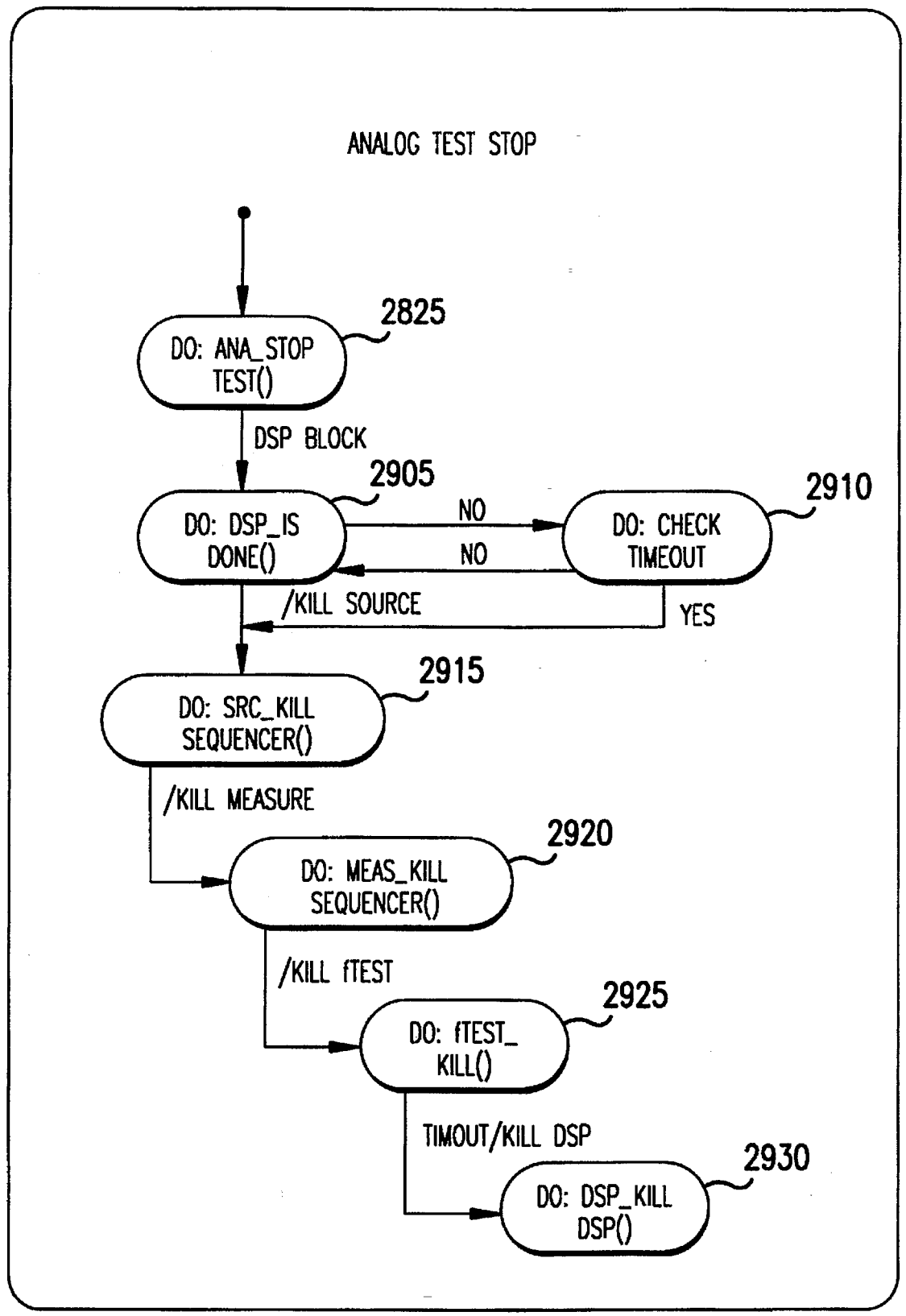
FIG. 29 shows a fourth "execute" sub-state diagram of analog elements in execution of a test in a mixed signal tester in accordance with the invention.

FIG. 28 shows a sub-state diagram of the analog test state 2615, including the start-test state at 2805 and its sub-states which start the measure sequencer at 2810, start the source sequencer at 2815 and start the functional test ("ftest") at 2820. When stop conditions occur, the test stops at state 2825 and the test result is transferred for processing in a DSP at state 2830. FIG. 29 shows a sub-state diagram of analog test stop. The DSP is polled at state 2905 to determine if it has completed its operations, while a timeout clock is checked at state; 2910. When the DSP has completed its operations or the timeout clock has run, the source-sequencer is stopped at 2915, the measure-sequencer is stopped at 2920, the "ftest" is terminated at 2925, and the DSP is stopped at 2930.

Figure 22:
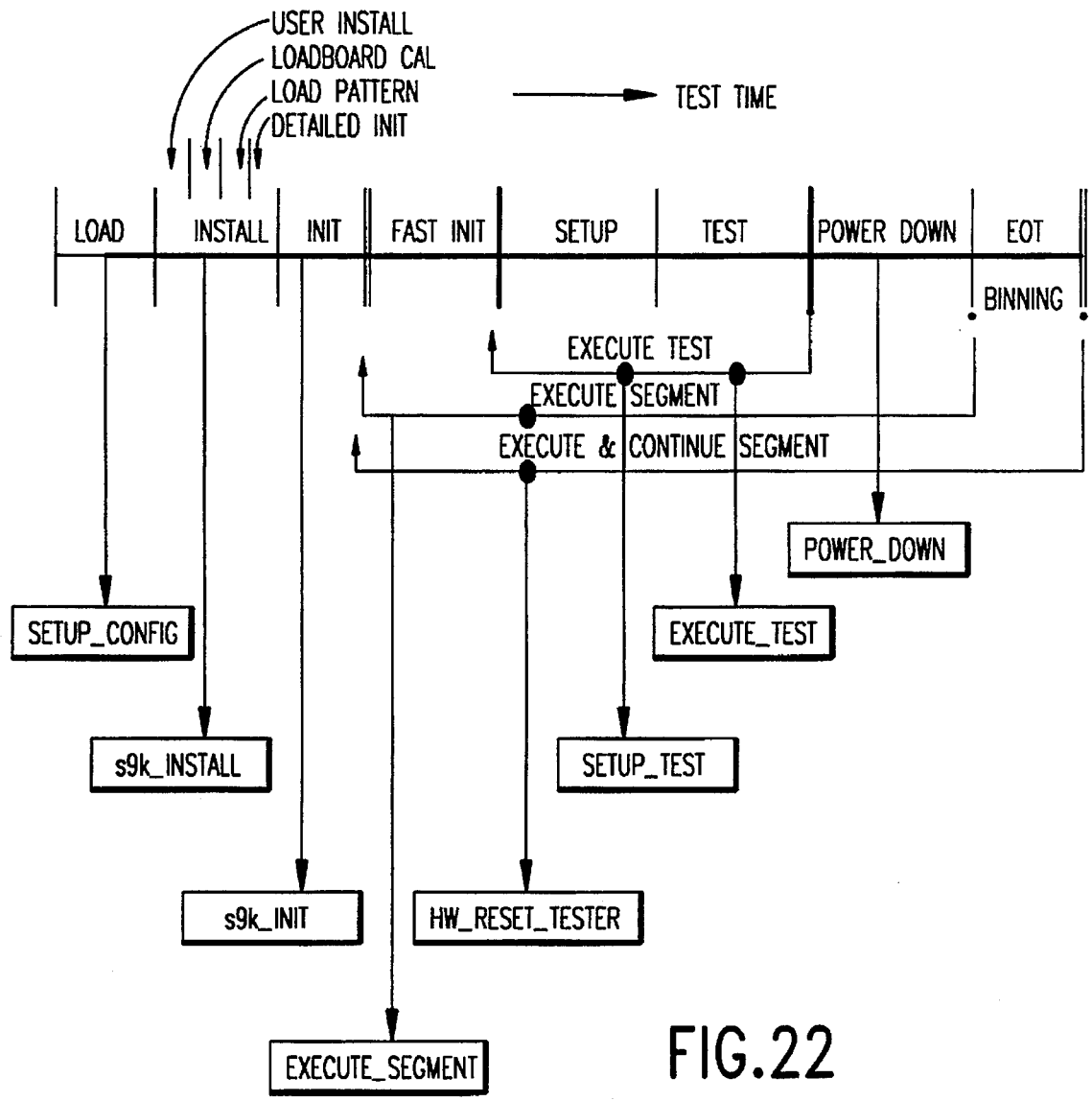
FIG. 22 shows operational sequences of a mixed-signal test in accordance with the invention.

FIG. 22 shows the ordering of runtime states to complete an entire runtime test execution cycle, along with associated high-level functions. The test program is loaded and installed, then the tester is initialized. The portion between the double vertical bars in FIG. 22 (from "Fast Init" through "EOT Binning") is the execute portion, which can be carried out in a variety of ways. In production, the execution cycle would be carried out as directed by the test program flow, e.g., once through for each device to be tested and binned upon commanding the test to begin. During programming and debugging, the user may perform just the "execute test" portion or the "execute segment" portion or the "execute & continue segment" portion.

It is noted that the "ftest_start" state 2820 occurs in response to an "EINST" (Enable INStrument) trigger which signals the start of the "ftest". This trigger is supplied to analog source sequencer 350 and to analog measure sequencer 355 as shown in FIG. 4. The EINST trigger is a synchronization signal between the digital subsystem and the analog instrumentation subsystems, and can for example be an 8-bit encoded signal having up to 256 unique triggering events supplied from instruction decoder 870 as shown in FIG. 8. The EINST trigger can be used, for example, to initiate the capture of an analog signal at a particular point relative to the digital pattern being applied to the DUT. It can also be used to initiate the source so that the analog-waveform stimulus applied to a DUT is always in the same phase relative to the digital pattern from test to test and from DUT to DUT. The EINST trigger can be used to control the source sequencer so that waveform information stored in the source sequencer can be coordinated with framing information in the digital pin slice electronics, e.g., telling the source sequencer when to advance by one data step so that the data falls into the frame at the proper time. Similarly, the EINST trigger can be used to instruct the measure sequencer when to extract captured data from a frame in accordance with stored framing information.

Figure 30:
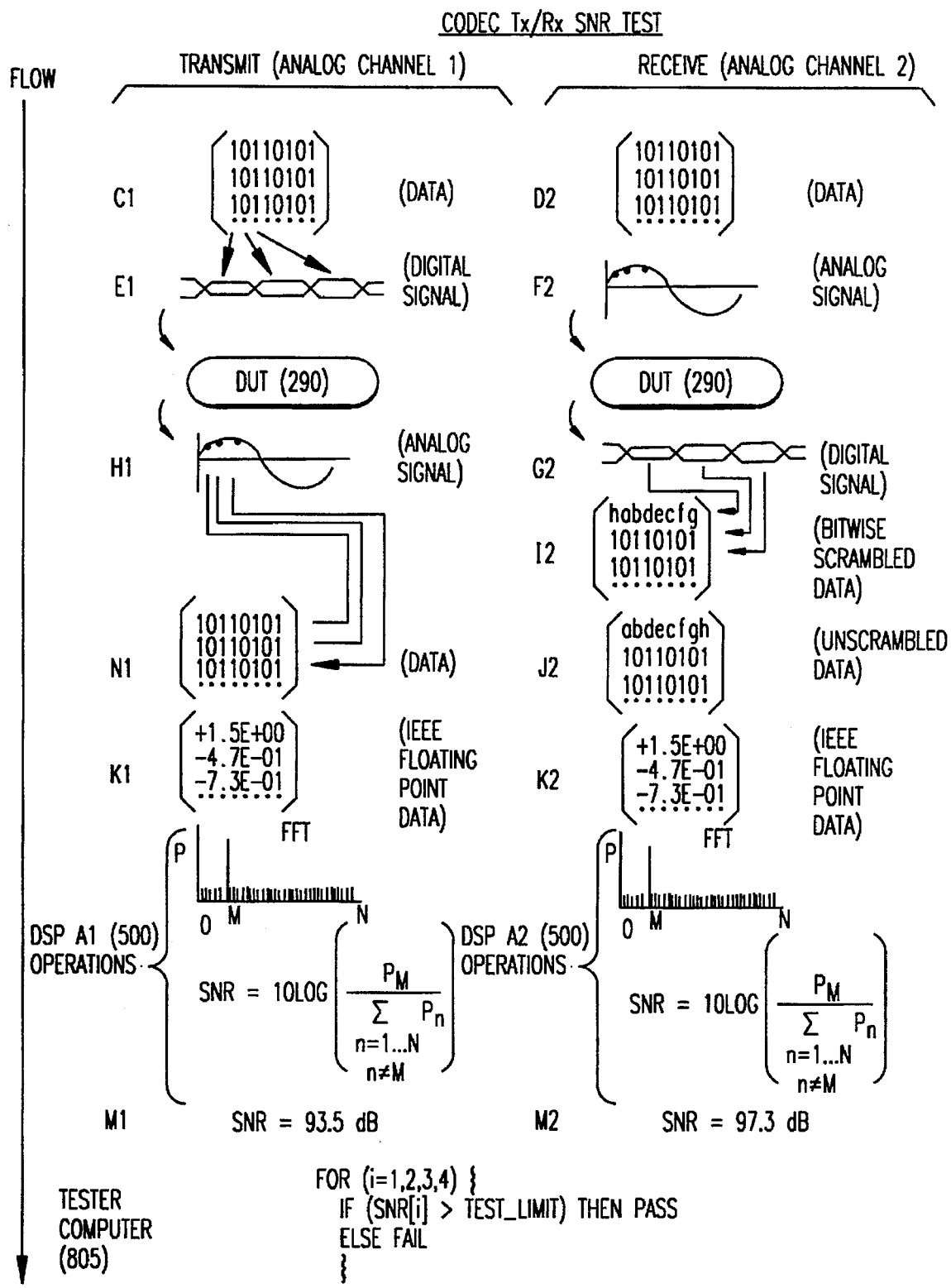
FIG. 30 shows principal signal operations of a codec transmit/receive signal-to-noise ratio test in accordance with the invention.

FIG. 30 shows the principal signal operations of one type of mixed-signal test, in which the signal-to-noise ratio of the transmit and receive sides of a codec are to be determined. A codec comprises a digital-to-analog (D/A) converter and an analog-to-digital (A/D) converter on a single chip, perhaps with other circuitry included. The left column of FIG. 30 shows the operations in testing the transmit (D/A converter) side of the codec. The right column of FIG. 30 shows the operations in testing the receive (A/D converter) side of the codec. A digital representation of a test signal, in this case a sine wave, is created in the tester CPU 805 and loaded into the memory of analog source sequencer 350 during system setup. It is assumed that the tester has been setup as instructed by the user and that all necessary setup information has been communicated via VTI 828, THI 858 and the high-speed bus connected to the HSI units 830, 840, 850, etc.

When the test begins, analog source sequencer 350 passes the digital representation via path C1 of the analog channel to subroutine memory and alternate data mux 405. It is noted that the path is indicated as path C in FIG. 30, while there is actually one such path for each off our analog channels; for convenience of description, path C of analog channel 1 is referred to as path C1, path C of analog channel 2 is referred to as path C2, path E of analog channel 1 is referred to as E1, etc. To simplify the following descriptions, it will be understood that when data are transferred for example via path D1, they are supplied by the analog source sequencer 350 of analog channel 1 and received by the waveform source electronics 380 of analog channel 1. DSP-A of analog channel 1 is referred to as DSP-A1 and that of analog channel 2 as DSP-A2.

During system setup, digital pin slice electronics 410 are provided with user-defined information about how the data is to be framed and formatted for the DUT, including signal levels and timing. During test, the data on path C1 is inserted into the frames under control of subroutine memory and alternate data mux 405 and is formatted in the digital pin slice electronics 410 as appropriate to the DUT. The resulting digital signal is supplied to the DUT via digital pin electronics 415 and path E1.

The output of the DUT is an analog sine-wave signal which is supplied via path H1 to the waveform measure pin electronics WFM 390, where it is digitized. The resulting data are sent via path N1 to analog measure sequencer 355, where it is converted to IEEE floating-point format. The IEEE floating-point data are transferred via path K1, super mezzanine 445 and path L1 to DSP-A1 500. DSP-A1 500 performs a fast-Fourier transform on the captured data, followed by computation of signal-to-noise ratio (SNR). After computing SNR, DSP-A1 holds a test result, in this example data representing a single floating-point SNR value of 93.5 dB. DSP-A1 500 can also compute other relationships of interest if so instructed by the user during setup, such as spurious free dynamic range, total harmonic distortion, etc. SNR is the ratio of the power in the fundamental frequency M to the power of all the other spectral components from 1 to N, typically excluding DC. Total harmonic distortion is the ratio of the power in the fundamental frequency M to the power in the harmonics of the fundamental frequency, e.g., the ratio of the power at f0 to the sum of the power at 2f0, 3f0 and 4f0. Spurious free dynamic range is the ratio of the power in the fundamental signal to the power in the next largest spectral component.

While the codec's D/A converter is being tested in analog channel 1, the codec's A/D converter is simultaneously tested in analog channel 2. Digital data representing a sine wave is supplied by analog source sequencer 350 via path D2 to waveform source 380. Waveform source applies a corresponding analog sine wave to the DUT's A/D converter on path F2. The output of the A/D converter is digital data which is supplied through path G2 and digital pin electronics 420 to digital pin slice electronics 425. At digital pin slice electronics 425, the digital data are compared to logic thresholds and sampled at the appropriate times, using threshold and timing information defined by the user during system setup. The resulting digital data on path I2 is typically scrambled bit-wise because the loadboard is preferably designed to connect each DUT pin to the nearest tester pin without crossing signal paths. The bit-wise scrambled data on path I2 is unscrambled by H-fail mux 430 and analog mux 435, the muxes having been configured appropriately during system setup. The unscrambled data on path J2 is converted in analog measure sequencer 355 to IEEE floating-point format, the preferred format for DSP operations, and supplied to DSP-A2 500 via path K2, super mezzanine 445 and path L2. DSP-A2 500 performs a fast-Fourier transform on the data and computes SNR and any other user-defined parameters. After computing SNR, DSP-A2 holds a test result, in this example a single floating-point number representing the SNR value 97.3 dB.

When finished with its operations, each of DSP-A1 and DSP-A2 so informs CPU 805. When interrogated by CPU 805, DSP-A1 and DSP-A2 transfer the SNR values to CPU 805, which then tests the SNR values against test limits established by the user during system setup. CPU 805 determines whether the codec is within limits and has passed the test or is out of limits and has failed the test. If the tester has four analog channels, as in the described embodiment, the transmit and receive side of two such codecs can be tested simultaneously. Similarly, any combination of up to four A/D and D/A converters can be tested at the same time.

Figure 31:
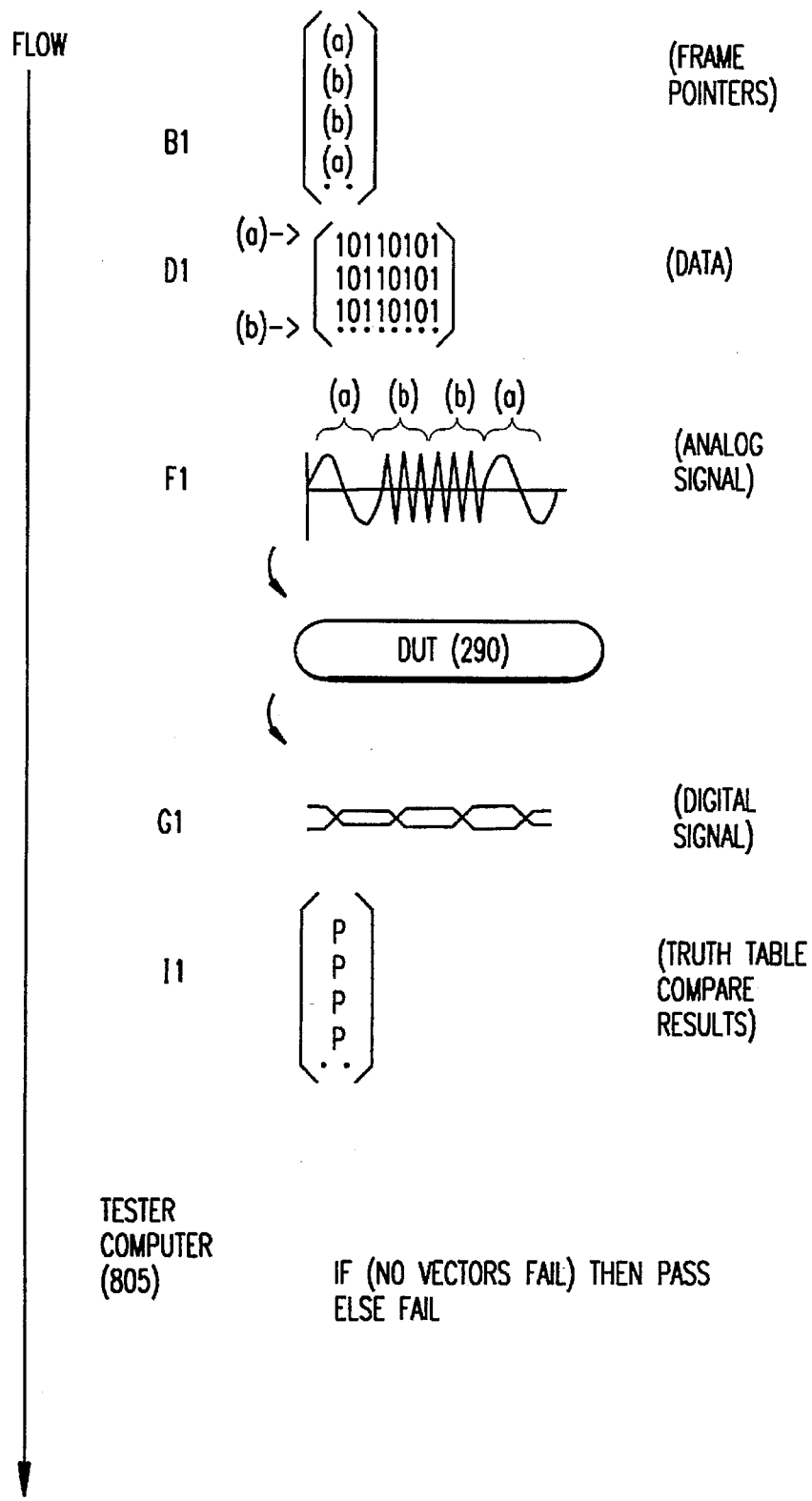
FIG. 31 shows principal signal operations of a modem bit-error rate test in accordance with the invention.

FIG. 31 shows the principal signal operations of a modem bit-error test, sometimes called a modem bit-error-rate test. The DUT, a modem, is to be driven with an analog signal and its output checked for errors. It is assumed that appropriate setup information has been supplied to the test system elements prior to beginning the test. During setup, data representing waveform segments is stored in the memory of analog source sequencer 350 so that data representing a waveform is produced by analog source sequencer 350 in response to frame pointers from DSP-B 505. During this test, analog source sequencer 350 is operated in the DSP-address mode, so that when DSP-B1 505 generates a user-defined sequence of frame pointers (a,b,b,a, etc.) on path B1, analog source sequencer provides data on path D1 representing the corresponding sequence of waveform segments. The data on path D1 is converted by waveform source 380 to an analog signal which it applies to the DUT on path F1. In the example shown, the DUT is driven with a frequency-shift-keyed (FSK) signal, though the same DSP addressing technique can be used to generate phase-shift-keyed, multi-level, quadrature-modulated or other signals. The DUT converts the applied analog signal to digital words which are supplied via path G1 and digital pin electronics 420 to digital pin slice electronics 425. In this test, the expected values of the digital words will have been stored in pin slice electronics 425 during test system setup. These expected values are the same as the user-defined pattern used to produce the analog signal to the DUT. Digital pin slice electronics 425 compares the digital words from the DUT with the expected values in real time as in the standard ITS 9000FX digital tester and can set a hardware failure-detect flag when an error is detected. Depending on how the user has setup the tester, the test is terminated when the failure-detect flag is set or can continue testing to gather additional data for debugging. The failure-detect flag and/or data to be used for debugging can be sent to CPU 805 via HSI 840 and VTI 828 at the conclusion of the test. CPU 805 determines from the flag and/or data whether the DUT has passed or failed the bit-error test.

The mixed-signal tester of the present invention is also suitable for conducting an A/D converter servo-loop code-edge-transition accuracy test. An A/D converter has an infinite number of possible analog input values over a continuous range, but only a discrete number of digital output values. To properly characterize an A/D converter, it is necessary to know each of the input voltages which causes the output to transition from one code to the next. One way to determine the code-edge-transition voltages is to apply voltages to the DUT and to monitor its response.

Figure 32:
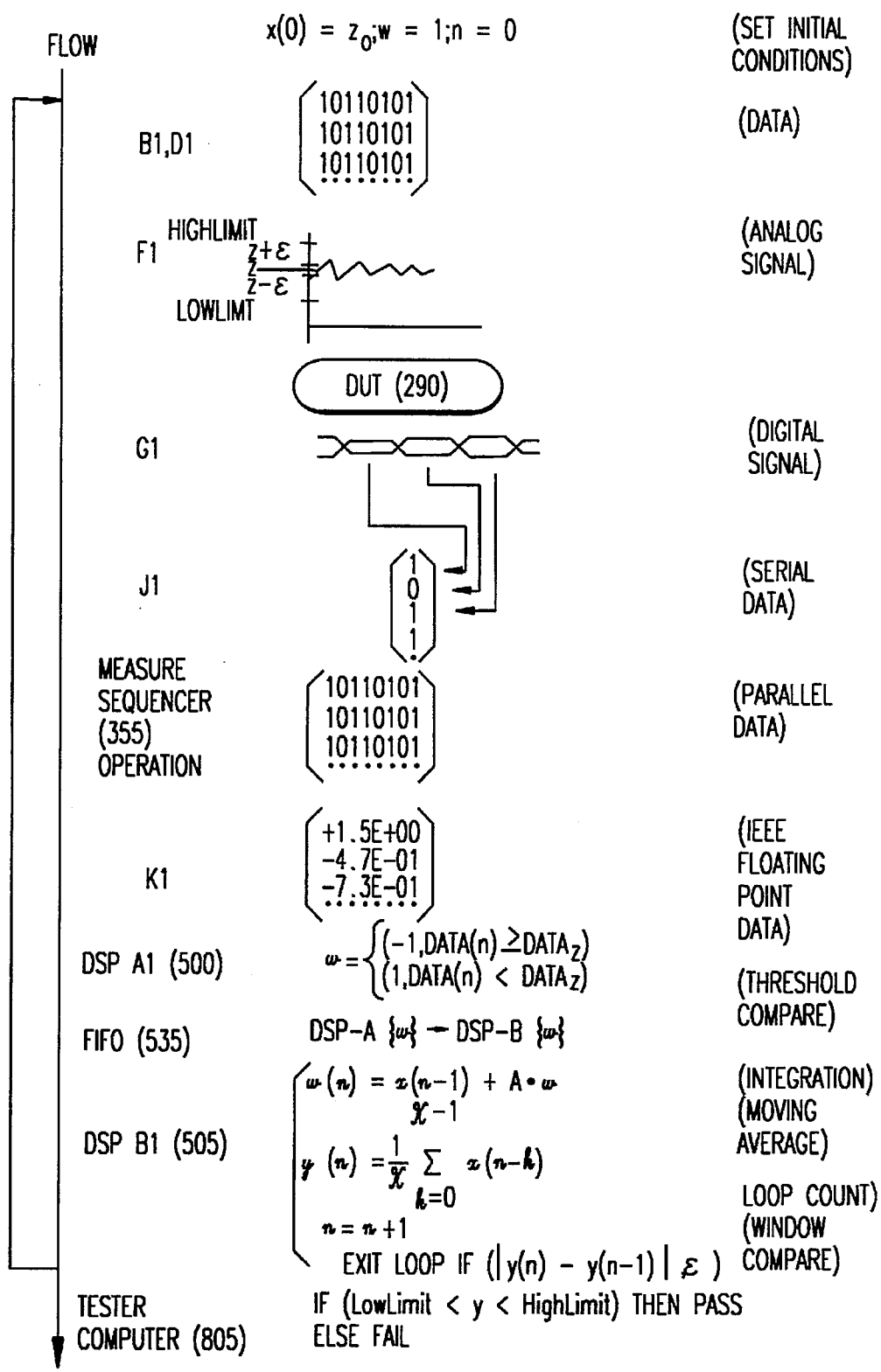
FIG. 32 shows principal signal operations of an A/D servo-loop code-edge-transition accuracy test in accordance with the invention.

FIG. 32 shows the primary signal flow in an analog channel when conducting such a test. The aim is to find the analog input voltage z which must be applied to the DUT in order to produce at the output of the DUT a desired digital code DATAz on the positive side of the transition to be measured. The values HighLimit and LowLimit are user-defined limits for the analog values to be applied to the DUT. Value x(n) is the analog voltage that is applied to the DUT during a given iteration n of the test process. Values z+ε and z−ε are user-defined limits of an acceptable error band in the determined value of z (i.e., ε is the acceptable resolution for measurement of z). Variable w is a polarity flag (having a value of +1 or −1) which indicates whether the next value of x(n) to be applied to the DUT should be increased or decreased from the previous iteration, i.e., whether applying the current value x(n) to the DUT produces an output code which is above or below the desired transition code DATAz. Value y(n) is a moving average of the values of x(n) applied to the DUT during the last K passes, where K is a user-defined number of iterations for the moving average. It is assumed that the test system has been initialized as instructed by the user before commencing the test.

Referring to FIG. 32, the process starts with variable x(0) set to a value representing a user-estimated value $z_0$ somewhat above or below the unknown value of z, and with variables w and n initialized. For example, if variable x(0) is set by the user to a value somewhat below the expected value of z, variable w is set to 1 to indicate that z is expected to be greater than the initial value of x(0). Variable n is initialized to 0 to indicate that this is to be the 0th iteration of the test loop. DSP-B1 505 supplies data representing value x(1) on path B1 to analog source sequencer 350. For this test, source sequencer 350 is in flow-through mode, so that the data is passed through without modification to signal path D1 and is thus supplied to waveform source 380. Waveform source 380 converts the data to a discrete analog voltage x(1) and applies the value to DUT 290 on path F1. The DUT converts the applied analog voltage x(1) to a formatted digital code on path G1. That digital code is passed through the digital pin electronics 420, unformatted by the digital pin slice electronics 425, passed through muxes 430 and 435, and applied as a serial data stream to analog measure sequencer 355. Analog measure sequencer 355 converts the serial data to parallel data in data packer 482, converts the parallel data to IEEE floating-point format in formatter 484, and supplies the floating-point representation of the DUT's output on path K1. The floating-point representation (DATAn) goes through super mezzanine 445 and via path L1 to DSP-A1 500, where it is compared with the code transition of interest, DATAz. If the value of code DATAn for this iteration n is greater than or equal to the value of code transition DATAz, then w is set to −1 for the next iteration. If the value of code DATAn is less than code transition DATAz, then w is set to +1 for the next iteration. DSP-A1 500 sends the value of w over path M1 to memory 535, where it is accessible to DSP-B1 505. DSP-B1 505 integrates the values of x(n) with each iteration, taking into account the polarity of variable w, e.g., x(n)=x(n−1)+A.w, where A is a user-defined variable which governs how much the value of x(n) will be incremented from one iteration of the test loop to the next. Variable A can be a constant value, but is preferably determined by a suitable algorithm which initially allows the value of x(n) to move by large steps until the value of z is bracketed, and which progressively reduces the step size to assure that the value of z will be determined with resolution acceptable to the user. Such a variable-step-size algorithm can reduce the number of iteration required to obtain the test result with a given resolution. DSP-B1 505 also maintains a moving average y(n) of the analog voltages x(n) applied to the DUT during the last K passes, e.g., $$y(n) = \left[\frac{1}{K}\right] \sum_{k=0}^{K-1} x(n-k)$$

where k is a summation index.

DSP-B1 then increments the value of n, and exits the test loop if the moving average has moved by less than the user-defined resolution, i.e., exit loop if (|y(n)−y(n−1)|<ε. If the moving average is not within the user-defined resolution, DSP-B1 sends a digital representation of the updated value of x(n) via path B1 to analog source sequencer 350. The flow loop is repeated until the DSP-B1 exits the test loop. Upon exiting the loop, DSP-B1 passes the value of y(n) to tester CPU 805.

If one were to monitor the voltage over time at signal path F1 over many passes through the flow loop, it would tend to increase until overshooting the value z, then decrease until undershooting the value z, and so on. That is, the voltage at signal path F1 would over many passes appear to oscillate about the code-transition voltage z, somewhat like a sawtooth wave of progressively decreasing amplitude. When this voltage signal stabilizes about z within the user-defined resolution limit, as indicated by a stabilized moving average y(n), the value of y(n) can be taken as the code-edge transition voltage.

Those of skill in the art will recognize that many modifications in the apparatus and methods described above are possible within the spirit and scope of the invention as defined in the following claims.

We claim:

1. Apparatus for testing a mixed-signal integrated-circuit device-under-test (DUT), comprising:
   a. a master clock 250;
   b. a plurality of digital channels, each digital channel having
      i. digital pin slices 310, 315 for receiving timing reference from the master clock 250 and communicating with digital pin electronics;
      ii. digital pin electronics 325, 330 communicating with the digital pin slices for applying digital signals to and receiving digital signals from a DUT 290; and c. a plurality of analog channels, each analog channel having
   i. an analog source sequencer 350 under control of a DSP module 340 for generating digital representations of analog signals to be applied to the DUT 290;
   ii. analog pin electronics 345 responsive to the analog source sequencer 350 for applying analog signals to the DUT 290 and for receiving analog signals from a DUT 290;
   iii. an analog measure sequencer 355 responsive to the analog pin electronics 345 for preparing digital representations of analog signals produced by the DUT 290; and
   iv. a programmable DSP module 340 for processing representations of analog signals stored in the analog measure sequencer 355 and for supplying control information to the analog source sequencer 350.

2. The apparatus of claim 1, wherein the DSP module 340 comprises a first DSP 500, a second DSP 505, and at least one memory 530, 535 accessible to the first DSP 500 and to the second DSP 505.

3. The apparatus of claim 2, wherein the first DSP 500 is programmed to receive digital representations of analog signals prepared by the analog measure sequencer 355, process the digital representations of analog signals to produce a result, and store the result in said memory, and wherein the second DSP 505 is programmed to access the result stored in said memory and control the analog source sequencer in dependence on said result.

4. The apparatus of claim 2, wherein said at least one memory comprises a global memory 535.

5. The apparatus of claim 2, wherein said at least one memory comprises an inter-DSP first-in-first-out memory 530.

6. The apparatus of claim 2, wherein the DSP module 340 further comprises a data memory 520 and a program memory 550 in communication with the first DSP 500, and a data memory 525 and a program memory 555 in communication with the second DSP 505.

7. The apparatus of claim 1, wherein the DSP module 340 comprises a DSP engine 440, a first memory 460, a second memory 465, and a multi-state switch 455 serving when in a first state to selectively pass capture data from analog measure sequencer 355 for storage in the first memory 460 while data in the second memory 465 is accessible to the DSP engine 440, and switch 455 serving when in a second state to selectively pass capture data from analog measure sequencer 355 for storage in the second memory 465 while data in the first memory 460 is accessible to the DSP engine 440.

8. The apparatus of claim 7, wherein the DSP engine 440 comprises a first DSP 500, a second DSP 505, and at least one memory 530, 535 accessible to the first DSP 500 and to the second DSP 505.

9. The apparatus of claim 1, wherein each analog channel further comprises an analog clock source 240 referenced to the master clock 250, and wherein the analog source sequencer 350 and the analog measure sequencer of the channel are responsive to clock signals from the analog clock source 240.

10. The apparatus of claim 1, wherein the analog pin electronics 345 includes a waveform source 380, input and output filters 385 and a waveform measurer 390.

11. The apparatus of claim 10, wherein the analog-source sequencer 350 generates digital representations of analog signal patterns to be applied to DUT 290 under control of programmable DSP module 340 in synchronization with clock signals from analog clock source 240, and waveform source 380 converts the digital representations to analog stimulus signals which drive DUT 290.

12. The apparatus of claim 10, wherein the waveform measurer 390 generates digital representations of analog response signals received from DUT 290, and analog measure sequencer 355 receives and stores the digital representations from waveform measurer 390 for processing by DSP module 340.

13. The apparatus of claim 1, wherein the analog source sequencer 350 comprises a first-in-first-out memory 470 for storing data received from DSP module 340, a sequencer 472 responsive to synchronization signals from a synchronizer 474, a sequencer memory 476 and a multiplexer 478.

14. The apparatus of claim 13, further comprising a subroutine memory and alternate-data multiplexer 405, and wherein multiplexer 478 supplies digital representations of analog signals through the subroutine memory and alternate-data multiplexer 405 and through the digital pin slices 410 to the digital pin electronics 415.

15. The apparatus of claim 13, further comprising a subroutine memory and alternate-data multiplexer 405 and a waveform source 380, wherein multiplexer 478 supplies digital representations of analog signals to the waveform source 380 and wherein waveform source 380 is responsive to the digital representations of analog signals for applying analog signals to the DUT 290.

16. The apparatus of claim 1, wherein analog measure sequencer 355 comprises a multiplexer 480, a data packer 482, a data formatter 484, and a synchronizer 486.

17. The apparatus of claim 16, wherein digital representations of analog data from DUT 290 are passed through the digital pin electronics 325,420 and the digital pin slices 315, 425 to a multiplexer 435, and further comprising a multiplexer 435 for passing the digital representations of analog data to analog measure sequencer 355.

18. The apparatus of claim 17, wherein the analog measure sequencer 355 formats the digital representations of analog data received from the multiplexer 435 and transfers the resulting formatted signals to the DSP module 340.

19. The apparatus of claim 16, wherein the analog pin electronics comprise a waveform measurer 390 for digitizing analog signals produced by the DUT 290 and for passing the digitized signals to the analog measure sequencer 355.

20. The apparatus of claim 19, wherein the analog measure sequencer 355 formats the digitized signals from waveform measurer 390 and transfers the resulting formatted signals to the DSP module 340.

21. The apparatus of claim 1, further comprising an analog-channel clock signal generator 240 for producing clock signals of selected frequency, and wherein the analog source sequencer 350 and the analog measure sequencer 355 are synchronized by the clock signals of selected frequency to source signals to and measure signals from the DUT 290 at a desired analog frequency or digital data rate.

22. The apparatus of claim 1, further comprising a central processing unit 805 with memory 810, and a bus 565 for communication of data between the central processing unit 805 and the DSP module 340.

* * * * *